(12) United States Patent
Chen et al.

(10) Patent No.: US 11,189,583 B2
(45) Date of Patent: Nov. 30, 2021

(54) SEMICONDUCTOR STRUCTURE AND MANUFACTURING METHOD THEREOF

(71) Applicant: Taiwan Semiconductor Manufacturing Co., Ltd., Hsinchu (TW)

(72) Inventors: Sheng-Chau Chen, Tainan (TW); Shih-Pei Chou, Tainan (TW); Ming-Che Lee, Tainan (TW); Kuo-Ming Wu, Hsinchu County (TW); Cheng-Hsien Chou, Tainan (TW); Cheng-Yuan Tsai, Hsin-Chu County (TW); Yeur-Luen Tu, Taichung (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 0 days.

(21) Appl. No.: 16/723,041

(22) Filed: Dec. 20, 2019

(65) Prior Publication Data
US 2020/0144207 A1 May 7, 2020

Related U.S. Application Data

(62) Division of application No. 15/727,041, filed on Oct. 6, 2017, now Pat. No. 10,522,487, which is a division
(Continued)

(51) Int. Cl.
*H01L 23/48* (2006.01)
*H01L 23/00* (2006.01)
(Continued)

(52) U.S. Cl.
CPC ........ *H01L 24/05* (2013.01); *H01L 21/76898* (2013.01); *H01L 23/481* (2013.01);
(Continued)

(58) Field of Classification Search
CPC ......... H01L 23/481; H01L 2224/13025; H01L 2224/06182; H01L 2224/0603; H01L 2224/05075–05084; H01L 2224/05073; H01L 2224/0502–05027; H01L 2224/0501–05019; H01L 2224/05005–05009; H01L 2224/0554–05999;
(Continued)

(56) References Cited

U.S. PATENT DOCUMENTS 7,056,820 B2  6/2006  Cole et al.
7,656,473 B2  2/2010  Ha et al.
(Continued)

FOREIGN PATENT DOCUMENTS

TW  201209963 A  3/2012
TW  201541606 A  11/2015

*Primary Examiner* — Jarrett J Stark
(74) *Attorney, Agent, or Firm* — Haynes and Boone, LLP

(57) ABSTRACT

The present disclosure provides a semiconductor structure. The semiconductor structure comprises a semiconductive substrate and an interconnect structure over the semiconductive substrate. The semiconductor structure also comprises a bond pad in the semiconductive substrate and coupled to the metal layer. The bond pad comprises two conductive layers.

20 Claims, 20 Drawing Sheets

Related U.S. Application Data of application No. 15/156,764, filed on May 17, 2016, now Pat. No. 9,786,619.

(60) Provisional application No. 62/273,461, filed on Dec. 31, 2015.

(51) Int. Cl.
  *H01L 25/065* (2006.01)
  *H01L 25/00* (2006.01)
  *H01L 21/768* (2006.01)

(52) U.S. Cl.
  CPC .............. *H01L 24/02* (2013.01); *H01L 24/03* (2013.01); *H01L 24/13* (2013.01); *H01L 24/92* (2013.01); *H01L 25/0657* (2013.01); *H01L 25/50* (2013.01); *H01L 24/06* (2013.01); *H01L 24/11* (2013.01); *H01L 24/48* (2013.01); *H01L 2224/0239* (2013.01); *H01L 2224/02331* (2013.01); *H01L 2224/0345* (2013.01); *H01L 2224/03452* (2013.01); *H01L 2224/03462* (2013.01); *H01L 2224/03464* (2013.01); *H01L 2224/0401* (2013.01); *H01L 2224/04042* (2013.01); *H01L 2224/05009* (2013.01); *H01L 2224/05016* (2013.01); *H01L 2224/05017* (2013.01); *H01L 2224/05019* (2013.01); *H01L 2224/0557* (2013.01); *H01L 2224/05082* (2013.01); *H01L 2224/05088* (2013.01); *H01L 2224/05091* (2013.01); *H01L 2224/05139* (2013.01); *H01L 2224/05144* (2013.01); *H01L 2224/05147* (2013.01); *H01L 2224/05155* (2013.01); *H01L 2224/05184* (2013.01); *H01L 2224/05557* (2013.01); *H01L 2224/05559* (2013.01); *H01L 2224/05572* (2013.01); *H01L 2224/0603* (2013.01); *H01L 2224/06182* (2013.01); *H01L 2224/131* (2013.01); *H01L 2224/13025* (2013.01); *H01L 2224/13026* (2013.01); *H01L 2224/92* (2013.01); *H01L 2224/9202* (2013.01); *H01L 2224/9222* (2013.01); *H01L 2225/06513* (2013.01); *H01L 2924/00014* (2013.01); *H01L 2924/3512* (2013.01); *H01L 2924/35121* (2013.01)

(58) Field of Classification Search
  CPC ...................... H01L 2224/05001–05499; H01L 2224/05575–05584; H01L 2224/0556–05572; H01L 2224/0555–05559; H01L 2224/05541–05548
  See application file for complete search history.

(56) References Cited

U.S. PATENT DOCUMENTS

| | | | |
|---|---|---|---|
| 8,330,274 B2 | 12/2012 | Barth et al. | |
| 8,487,410 B2 | 7/2013 | Yu et al. | |
| 8,552,563 B2 | 10/2013 | Law et al. | |
| 8,679,971 B2 | 3/2014 | Farooq et al. | |
| 8,742,574 B2 | 6/2014 | Samoilov et al. | |
| 8,742,591 B2 | 6/2014 | Choi et al. | |
| 8,932,906 B2 | 1/2015 | Wang et al. | |
| 8,956,966 B2 | 2/2015 | Lin et al. | |
| 9,214,411 B2 | 12/2015 | Park et al. | |
| 9,299,663 B2 | 3/2016 | Wirz et al. | |
| 9,553,058 B1 | 1/2017 | England et al. | |
| 9,666,520 B2 | 5/2017 | Yu et al. | |
| 9,704,781 B2 | 7/2017 | Wirz et al. | |
| 9,786,835 B2 | 10/2017 | Adkisson et al. | |
| 2005/0245070 A1* | 11/2005 | Andricacos | H01L 21/2885 438/627 |
| 2009/0026635 A1 | 1/2009 | Momono et al. | |
| 2010/0047963 A1 | 2/2010 | Wang et al. | |
| 2010/0252934 A1 | 10/2010 | Law et al. | |
| 2012/0193785 A1 | 8/2012 | Lin et al. | |
| 2012/0261827 A1 | 10/2012 | Yu et al. | |
| 2013/0016824 A1 | 1/2013 | Flannery et al. | |
| 2013/0027241 A1 | 1/2013 | Sego et al. | |
| 2013/0037948 A1 | 2/2013 | Samoilov et al. | |
| 2013/0161824 A1 | 6/2013 | Choi et al. | |
| 2013/0207241 A1 | 8/2013 | Lee et al. | |
| 2013/0264720 A1 | 10/2013 | Chun et al. | |
| 2014/0015122 A1* | 1/2014 | Chou | H01L 23/3192 257/737 |
| 2014/0159249 A1 | 6/2014 | Uzoh | |
| 2014/0332952 A1 | 11/2014 | Kuo et al. | |
| 2014/0339699 A1* | 11/2014 | Arvin | H01L 23/49866 257/738 |
| 2015/0093880 A1* | 4/2015 | Ji | H01L 21/02013 438/459 |
| 2015/0102497 A1 | 4/2015 | Park et al. | |
| 2015/0137345 A1* | 5/2015 | Choi | H01L 23/04 257/713 |
| 2015/0137353 A1* | 5/2015 | Wirz | H01L 24/94 257/737 |
| 2015/0333014 A1 | 11/2015 | Wirz et al. | |
| 2015/0348871 A1 | 12/2015 | Chiang et al. | |
| 2016/0137353 A1 | 5/2016 | Uesugi et al. | |
| 2016/0155686 A1 | 6/2016 | Lee et al. | |
| 2016/0192490 A1 | 6/2016 | Kang et al. | |
| 2017/0053872 A1* | 2/2017 | Lee | H01L 21/76898 |
| 2017/0077052 A1 | 3/2017 | Mariottini et al. | |
| 2017/0125364 A1* | 5/2017 | Cho | G11C 5/025 |
| 2017/0373044 A1 | 12/2017 | Das et al. | |
| 2018/0006006 A1* | 1/2018 | Kim | H01L 24/94 |
| 2018/0138225 A1* | 5/2018 | Kim | H01L 27/14618 |

* cited by examiner

SEMICONDUCTOR STRUCTURE AND MANUFACTURING METHOD THEREOF

PRIORITY CLAIM AND CROSS-REFERENCE

This application is a divisional application of application Ser. No. 15/727,041, filed Oct. 6, 2017, issuing as U.S. Pat. No. 10,522,487, which is a divisional application of application Ser. No. 15/156,764, filed May 17, 2016, now U.S. Pat. No. 9,786,619, which claims priority from Provisional Application No. 62/273,461 filed Dec. 31, 2015, the disclosures of which are hereby incorporated by reference in their entirety.

BACKGROUND

Electronic equipment involving semiconductive devices are essential for many modern applications. Technological advances in materials and designs have produced generations of semiconductive devices where each generation has smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductive devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
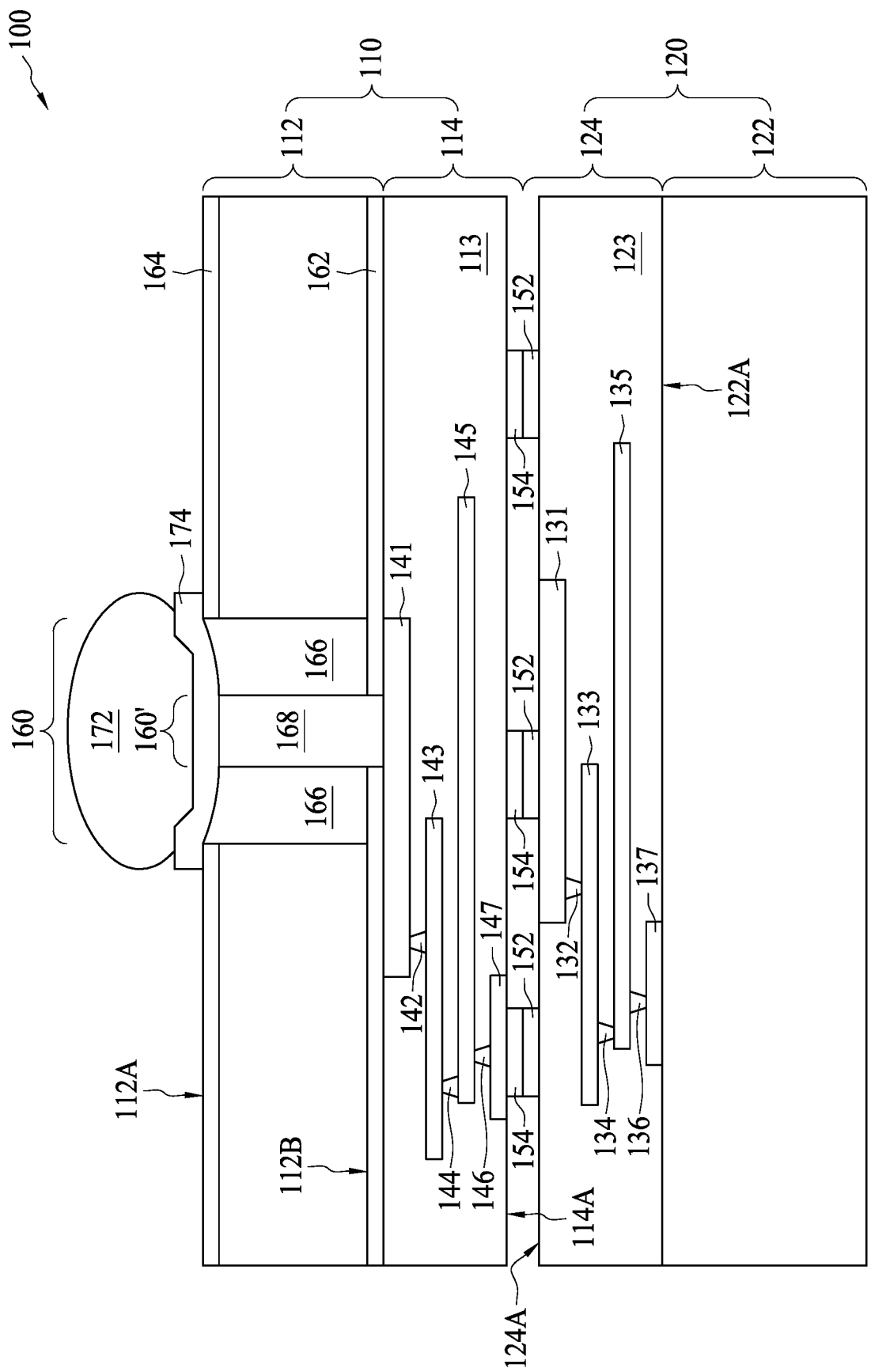
FIG. 1A is a schematic view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to a semiconductor structure with an improved bond pad design. The bond pad is composed of materials with greater resistance to stress, such as pull stress or shear stress, during the manufacturing or packaging of the semiconductor structure. In addition, the semiconductor structure exhibits better bonding properties. Thus, the risk of structure cracking or peeling is effectively mitigated.

FIG. 1A is a schematic view of a semiconductor structure 100, in accordance with some embodiments of the present disclosure. The semiconductor structure 100 comprises a first semiconductor device 110 and a second semiconductor device 120. The first semiconductor device 110 comprises a first semiconductive substrate 112 and a first interconnect structure 114. The second semiconductor device 120 comprises a second semiconductive substrate 122 and a second interconnect structure 124.

The second semiconductor device 120 is configured to perform specific functions and communicate with the first semiconductor device 110. In some embodiments, the second semiconductor device 120 may include a logic circuit. In some embodiments, the second semiconductor device 120 may further include memory cells or other electrical components. In some embodiments, the second semiconductive substrate 122 may include a myriad of passive or active components (not shown) disposed on a surface 122A facing the second interconnect structure 124.

The second semiconductive substrate 122 includes a semiconductor material such as silicon. In some embodiments, the second semiconductive substrate 122 may include other semiconductor materials, such as silicon germanium, silicon carbide, gallium arsenide, or the like. In some embodiments, the second semiconductive substrate 122 is a p-type semiconductive substrate (acceptor type) or n-type semiconductive substrate (donor type). Alternatively, the second semiconductive substrate 122 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the second semiconductive substrate 122 is a semiconductor-on-insulator (SOI). In other alternatives, the second semiconductive substrate 122 may include a doped epi layer, a gradient semiconductor layer, and/or a semiconductor layer overlying another semiconductor layer of a different type, such as a silicon layer on a silicon germanium layer.

The second interconnect structure 124 is disposed over the second semiconductive substrate 122. In some embodiments, the second interconnect structure 124 is disposed between the first interconnect structure 114 and the second semiconductive substrate 122. The second interconnect structure 124 is configured to electrically couple electrical components within the second semiconductive substrate 122. In some embodiments, the second interconnect structure 124 is configured to electrically couple the second semiconductive substrate 122 with a device or component external to the second semiconductor device 120. In the present embodiment, the second interconnect structure 124 electrically couples the second semiconductive substrate 122 with the first interconnect structure 114 of the first semiconductor device 110. The second interconnect structure 124 may include multiple metal layers. Each of the metal layers may include conductive wires or lines and is electrically coupled to an adjacent overlaying or underlying metal layer through at least one metal via. In the present embodiment, metal layers 131, 133, 135 and 137 are disposed in a layered structure and are interconnected through corresponding metal vias 132, 134 and 136. The numbers and patterns of the metal layers and vias of the second interconnect structure 124 are provided for illustration. Other numbers of metal layers, metal vias, or conductive wires and alternative wiring patterns are also within the contemplated scope of the present disclosure.

Moreover, the aforesaid metal layers and metal vias are electrically insulated from other components. The insulation may be achieved by insulating materials. In some embodiments, the remaining portion of the second interconnect structure 124 may be filled with an inter-metal dielectric (IMD) 123. The dielectric material of IMD 123 may be formed of oxides, such as un-doped Silicate Glass (USG), Fluorinated Silicate Glass (FSG), low-k dielectric materials, or the like. The low-k dielectric materials may have k values lower than 3.8, although the dielectric materials of the IMD 123 may also be close to 3.8. In some embodiments, the k values of the low-k dielectric materials are lower than about 3.0, and may be lower than about 2.5.

The first semiconductor device 110 is configured to perform specific functions and communicate with the second semiconductor device 120. In some embodiments, the first semiconductor device 110 may be a sensing device, for example, a backside image (BSI) sensor device configured to capture image data. In some embodiments, the first semiconductive substrate 112 may include a myriad of passive or active components (not shown) disposed on a surface 112B facing the first interconnect structure 114.

The first interconnect structure 114 is disposed against the first semiconductive substrate 112. In some embodiments, the first interconnect structure 114 is disposed between the second interconnect structure 124 and the first semiconductive substrate 112. In some embodiments, the first interconnect structure 114 is configured to electrically couple the components of the first semiconductive substrate 112 with a device or component external to the first semiconductor device 110. In the present embodiment, the first interconnect structure 114 electrically couples the first semiconductive substrate 112 with the second interconnect structure 124 of the second semiconductor device 120. The first interconnect structure 114 may include multiple metal layers. Each of the metal layers includes at least one conductive line and is electrically coupled to an adjacent metal layer through at least one metal via. In the present embodiment, metal layers 141, 143, 145 and 147 are disposed in the second interconnect structure 114 and are interconnected through metal vias 142, 144 and 146.

In some embodiments, the remaining portion of the interconnect structure 114 may be filled with an IMD 113. The dielectric material for the IMD 113 may be formed of oxides, such as un-doped Silicate Glass (USG), Fluorinated Silicate Glass (FSG), low-k dielectric materials, or the like. The low-k dielectric materials may have k values lower than 3.8, although the dielectric materials of the IMD 113 may be also close to 3.8. In some embodiments, the k values of the low-k dielectric materials are lower than about 3.0, and may be lower than about 2.5.

In some embodiments, the first interconnect structure 114 further comprises several bond pads 154 on a surface 114A facing the second interconnect structure 124. In some embodiments, the second interconnect structure 124 comprises several bond pads 152 on a surface 124A facing the first interconnect structure 114. The bond pads 154 are aligned with corresponding bond pads 152 such that the first semiconductor device 110 and the second semiconductor device 120 are electrically bonded. In some embodiments, the bond pads 154 and 152 may protrude from the surface 114A and 124A, respectively. In some embodiments, the bond pads 152 are planar with the surface 114A. In some embodiments, the bond pads 154 are planar with the surface 124A. In some embodiments, the bond pads 152 and 154 are planar with the surface 114A and 124A, respectively, such that the surface 114A is in contact with the surface 124A.

The first semiconductive substrate 112 is disposed above the first interconnect structure 114. The first semiconductive substrate 112 may include silicon, silicon germanium, silicon carbide, gallium arsenide, and/or germanium. Alternatively, the first semiconductive substrate 112 may include a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, the first semiconductive substrate 112 may be formed of materials similar to the second semiconductive substrate 122. In some embodiments, the first semiconductive substrate 112 may include materials different from the second semiconductive substrate 122.

In some embodiments, the first semiconductor device 110 may include a dielectric layer 162 between the semiconductive substrate 112 and the second interconnect structure 114. In some embodiments, the first semiconductor device 110 may include a dielectric layer 164 external but against the semiconductive substrate 112. The dielectric layer 162 and dielectric layer 164 are respectively disposed on opposite sides of the semiconductive substrate 112. The dielectrics 162 and 164 may include a variety of dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like. In some embodiments, the dielectric 162 is formed of the same materials as that of the dielectric 164. In some embodiments, the dielectric 162 is formed of different materials from that of the dielectric 164.

In some embodiments, the first semiconductive substrate 112 includes a first via 160. The first via 160 comprises a terminal 168 and a dielectric 166. In some embodiments, the dielectric 166 surrounds the terminal 168 in a lateral direction substantially parallel to a top surface 112A of the first semiconductive substrate 112. In some embodiments, the dielectric 166 includes multiple dielectric materials. Alternatively, the dielectric 166 includes a multi-layer structure. The terminal 168 is extended through the semiconductive substrate 112 and configured to electrically couple the first interconnect structure 114 with an external component through a connector 172. In some embodiments, the dielectric 166 in the first via 160 includes a second via 160'. The terminal 168 is disposed in the second via 160'. The dielectric 166 surrounds the second via 160' in a lateral direction substantially parallel to a top surface 112A of the first semiconductor substrate 112. In some embodiments, the terminal 168 electrically connects the connector 172 with the metal layer 141 of the first interconnect structure 114. In some embodiments, the connector 172 is a wire bond or a solder bump.

In some embodiments, the semiconductor structure 100 may include an under bump metallurgy (UBM) 174 between the first via 160 and the connector 172. The UBM 174 is configured to provide better adhesion of the connector 172. In some embodiments, the UBM 174 covers the first via 160. In some embodiments, the UBM 174 includes a top surface higher than a top surface of the dielectric layer 164.

Figure 1B:
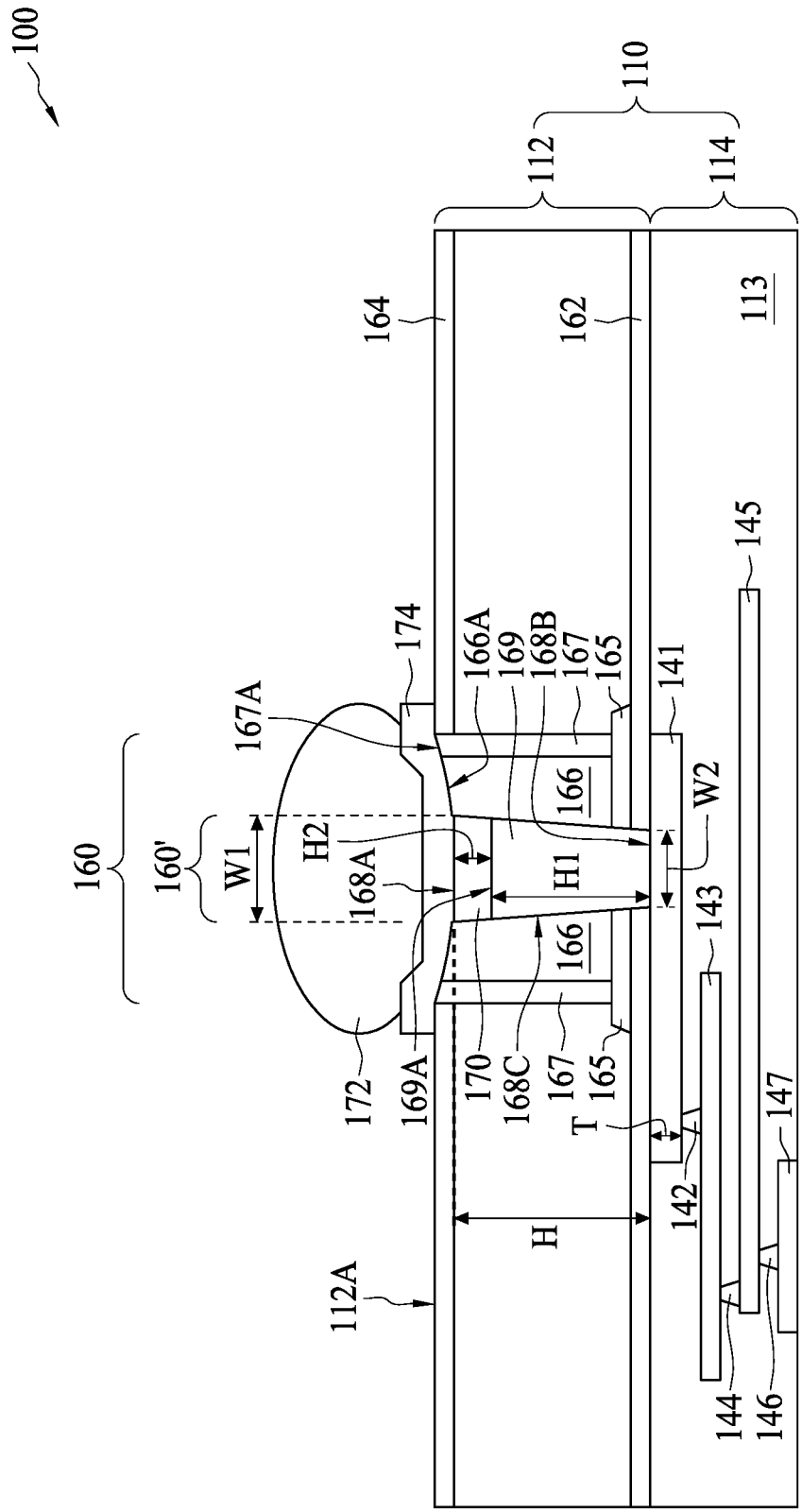
FIG. 1B is a schematic view of a semiconductor structure in accordance with some embodiments of the present disclosure.

FIG. 1B is an enlarged schematic view of a portion of the semiconductor structure 100 in FIG. 1A, in accordance with some embodiments of the present disclosure. Specifically, the first semiconductor device 110 is illustrated with more details. In some embodiments, the first semiconductive substrate 112 further comprises a dielectric 167. In some embodiments, the dielectric 167 is in the first via 160 and lining along sidewalls of the first via 160. In some embodiments, the dielectric 167 surrounds the dielectric 166 and the terminal 168 from a lateral direction substantially parallel to the top surface 112A of the first semiconductor substrate 112. Referring to FIG. 1B, the dielectric 167 surrounds a lateral side and a bottom side of the dielectric 166.

In some embodiments, the first semiconductive substrate 112 further comprises a dielectric 165. A portion of the dielectric 165 is in the first via 160. The dielectric 165 is disposed between the dielectric 162 and the bottom side of the dielectric 167. In some embodiments, the dielectric 165 has a top surface which includes an area larger than the cross-sectional area of the first via 160. In the present embodiments, the terminal 168 is electrically connected with the metal layer 141 and passes through the dielectrics 166, 167, 162 and 165. In other words, the terminal 168 is surrounded by the dielectrics 166, 167, 162 and 165 in a lateral direction substantially parallel to the top surface 112A.

In some embodiments, the metal layer 141 includes conductive materials such as gold, silver and tungsten. The metal layer 141 includes a thickness T measured from a direction perpendicular to the surface 112A. In some embodiments, the thickness T is from about 500 Å to about 3000 Å. In some embodiments, the thickness T is from about 1000 Å to about 3000 Å. In some embodiments, the thickness T is from about 1000 Å to about 2000 Å.

The terminal 168 is illustrated with shading in FIG. 1A. The terminal 168 is also illustrated with shading in FIG. 1B in a similar shape although not specifically labeled. In some embodiments, the terminal 168 serves as a conductive plug electrically coupling the connector 172 with the first interconnect structure 114. In some embodiments, the terminal 168 may be a bond pad. The bond pad 168 has a height H measured from a bottom surface 168B to a top surface 168A. In some embodiments, the height H may be from about 16,000 Å to about 35,000 Å. In some embodiments, the height H may be from about 20,000 Å to about 30,000 Å. In some embodiments, the height H may be from about 24,000 Å to about 28,000 Å.

The dielectric 166 has a top surface 166A. In some embodiments, the top surface 166A has a flat shape. In some embodiments, the top surface 166A has a curved shape such as a concave surface. In the present embodiments, the top surface 166A has an upwardly concave surface. The curved shape of the top surface 166A may be due to a dishing effect of a planarization process, such as the chemical mechanical polishing (CMP) operation.

In some embodiments, the dielectric 167 includes a top surface 167A. In some embodiments, the top surface 167A includes a flat shape. In some embodiments, the top surface 167A includes a curved shape such as a concave shape. For example, the top surface 167A may include an upwardly concave shape.

In some embodiments, the top surface 168A has a flat shape. In some embodiments, the top surface 168A has a curved shape. In some embodiments, the top surface 168A has a concave shape, such as a downwardly concave shape.

In some embodiments, the bond pad 168 has a sidewall 168C interfacing with the dielectric 166. The bond pad 168 has a top width W1 measured along a top level of the sidewall 168C and a bottom width W2 measured along the bottom surface 168B. In some embodiments, the top width W1 is larger than the bottom width W2. In some embodiments, the bond pad 168 includes a tapered shape from the top surface 168A to the bottom surface 168B.

In some embodiments, the top surface 168A is lower than the top surface 166A of the dielectric 166. In some embodiments, the top surface 168A meets with the top surface 166A of the dielectric 166. In some embodiments, the top surface 168A is lower than the top surface 112A of the dielectric 164. In some embodiments, the top surface 168A is substantially coplanar or leveled with the top surface 112A of the dielectric 164. In some embodiments, the top surface 168A is lower than a top surface 167A of the dielectric 167.

The bond pad 168 electrically couples to the metal layer 141 at the bottom surface 168B. In some embodiments, the bond pad 168 couples to the metal layer 141 via the single contact 168B. In some embodiments, the bond pad 168 comprises a flat bottom surface 168B in contact with the metal layer 141.

The bond pad 168 comprises at least two layers. In the present embodiment, the bond pad 168 (illustrated with shading while not labeled in FIG. 1B) comprises a first layer 169 and a second layer 170. The first layer 169 is coupled to the metal layer 141 of the first interconnect structure 114. In some embodiments, the first layer 169 includes a tapered shape from a cross-sectional view. In some embodiments, the first layer 169 may include a conductive material with Young's modulus from about 150 gigapascals (GPa) to about 250 GPa. In some embodiments, the first layer 169 may include a conductive material with Young's modulus from about 180 GPa to about 220 GPa. In some embodiments, the first layer 169 may include a conductive material with Young's modulus from about 190 GPa to about 210 GPa. In some embodiments, the first layer 169 may include metal such as gold, silver, copper, tungsten or nickel.

In some embodiments, the first layer 169 may include a conductive material with a weight percentage concentration from about 85% to about 100%. In some embodiments, the first layer 169 may include a conductive material with a weight percentage concentration from about 90% to about 100%. In some embodiments, the first layer 169 may include a conductive material with a weight percentage concentration from about 93% to about 95%. In some embodiments, the conductive material of the first layer 169 includes gold, silver, copper, tungsten or nickel.

The first layer 169 includes a height H1 measured from the bottom surface 168B to an upper surface 169A. In some embodiments, the height H1 is from about 15,000 Å to about 30,000 Å. In some embodiments, the height H1 is from about 15,000 Å to about 25,000 Å. In some embodiments, the height H1 is from about 20,000 Å to about 25,000 Å.

The second layer 170 electrically connects the first layer 169 with the UBM 174. In some embodiments, the second layer 170 is exposed from the dielectric 166. The second layer 170 has a top surface which is the top surface of the bond pad 168 and labeled as 168A. In some embodiments, the top surface 168A of the second layer 170 meets with the top surface 166A of the dielectric 166. In some embodiments, the top surface 168A is lower than the top surface 166A of the dielectric 166. In some embodiments, the second layer 170 includes a quadrilateral shape. In some embodiments, the second layer 170 includes a trapezoidal shape.

In some embodiments, the top surface 168A of the second layer 170 has a flat shape. In some embodiments, the top surface 168A of the second layer has a curved shape. In some embodiments, the top surface 168A of the second layer has a concave shape, such as a downwardly concave shape.

In some embodiments, the second layer 170 may include a conductive material with Young's modulus from about 50 GPa to about 120 GPa. In some embodiments, the second layer 170 may include a conductive material with Young's modulus from about 60 GPa to about 100 GPa. In some embodiments, the second layer 170 may include a conductive material with Young's modulus from about 70 GPa to about 80 GPa. In some embodiments, the second layer 170 may include metal such as gold, silver, copper, tungsten or nickel.

In some embodiments, the second layer 170 may include a conductive material with a weight percentage concentration from about 95% to about 100%. In some embodiments, the second layer 170 may include a conductive material with a weight percentage concentration from about 99% to about 100%. In some embodiments, the second layer 170 may include metal such as gold, silver, copper, tungsten or nickel.

The second layer 170 includes a height H2 measured from the surface 169A to the upper surface 168A. In the embodiments, the height H2 is from about 500 Å to about 3000 Å. In the embodiments, the height H2 is from about 1000 Å to about 3000 Å. In the embodiments, the height H2 is from about 1000 Å to about 2000 Å.

In some embodiments, a ratio of Young's modulus between the first layer 169 and the second layer 170 is from about 1.5 to about 3.5. In some embodiments, a ratio of Young's modulus between the first layer 169 and the second layer 170 is from about 2.0 to about 3.0. In some embodiments, a ratio of Young's modulus between the first layer 169 and the second layer 170 is from about 2.4 to about 2.6.

Figure 1C:
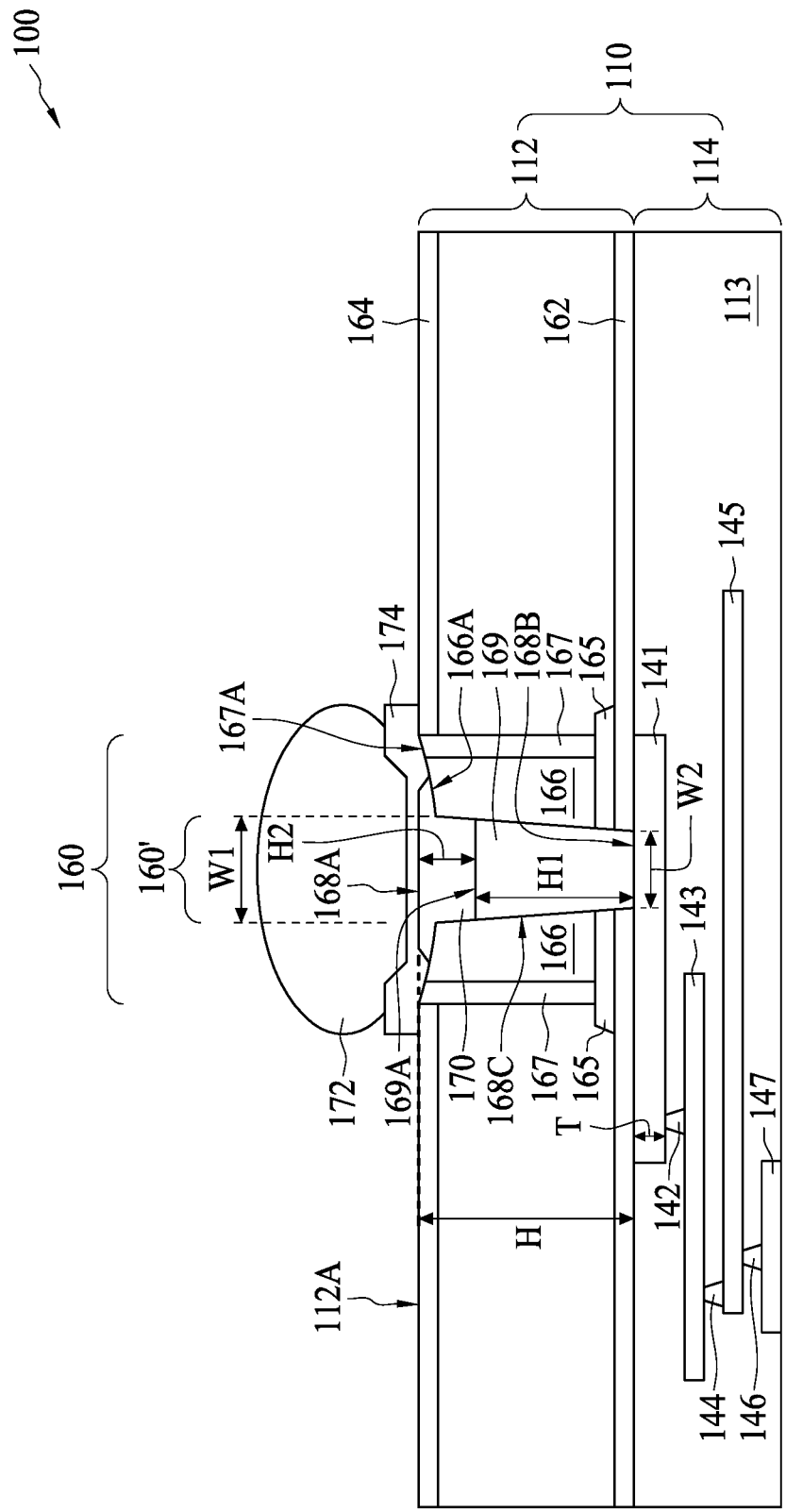
FIG. 1C is a schematic view of a semiconductor structure in accordance with some embodiments of the present disclosure.

FIG. 1C is an enlarged schematic view of a portion of the semiconductor structure 100 in FIG. 1A, in accordance with some embodiments of the present disclosure. Specifically, the first semiconductor device 110 is illustrated with more details. Referring to FIG. 1C, the top surface 168A is higher than the top surface 166A of the dielectric 166. In some embodiments, the top surface 168A is higher than the top surface 112A of the dielectric 164. In some embodiments, the top surface 168A is higher than the top surface 167A of the dielectric 167. In some embodiments, a portion of the bond pad 168 covers a portion of the dielectric 166. In some embodiments, a cap portion of the bond pad 168 extends over the dielectric 166. In some embodiments, the cap portion of the bond pad 168 extends along a direction parallel to the top surface 112A of the first semiconductive substrate 112. In some embodiments, the dielectric 166 is covered partially by the UBM 174 and partially by the bond pad 168.

In some embodiments, the second layer 170 covers a portion of the top surface 166A of the dielectric 166. In some embodiments, the second layer 170 extends over the dielectric 166. In some embodiments, the top surface 168A of the second layer 170 has a flat shape. In some embodiments, the top surface 168A of the second layer 170 has a curved shape, such as a concaved shape. In some embodiments, the upper surface 169A meets with a top level of the sidewall 168C such that the second layer 170 is higher than the top surface 166A of the dielectric 166. In some embodiments, the cap portion of the second layer 170 includes a quadrilateral shape. In some embodiments, the cap portion of the second layer 170 includes a trapezoidal shape. In some embodiments, the cap portion of the second layer 170 covers a portion of the dielectric 166.

Figure 2A:
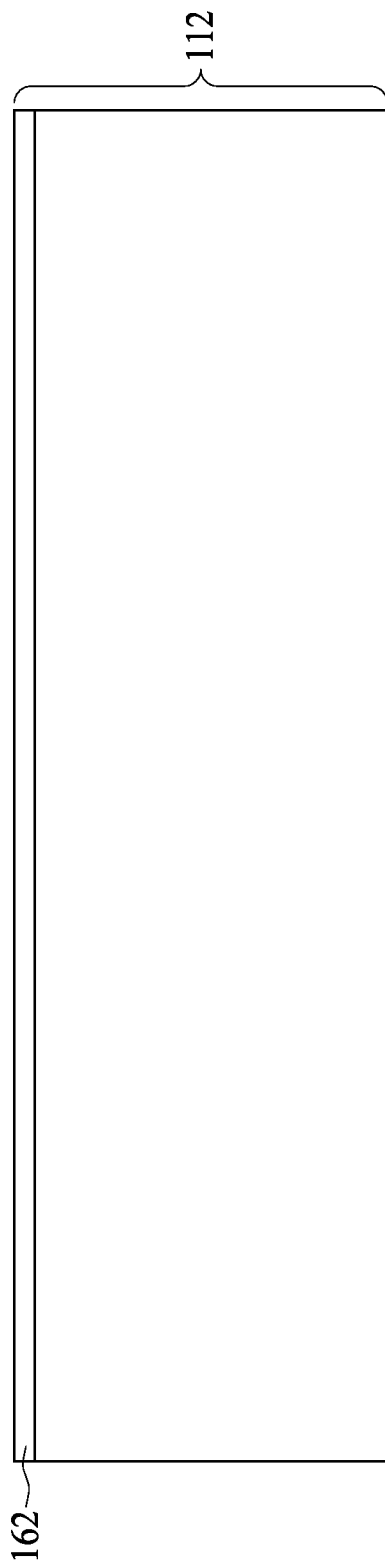
FIGS. 2A-2Q are schematic views of manufacturing a semiconductor structure in accordance with some embodiments of the present disclosure.
Figure 2B:
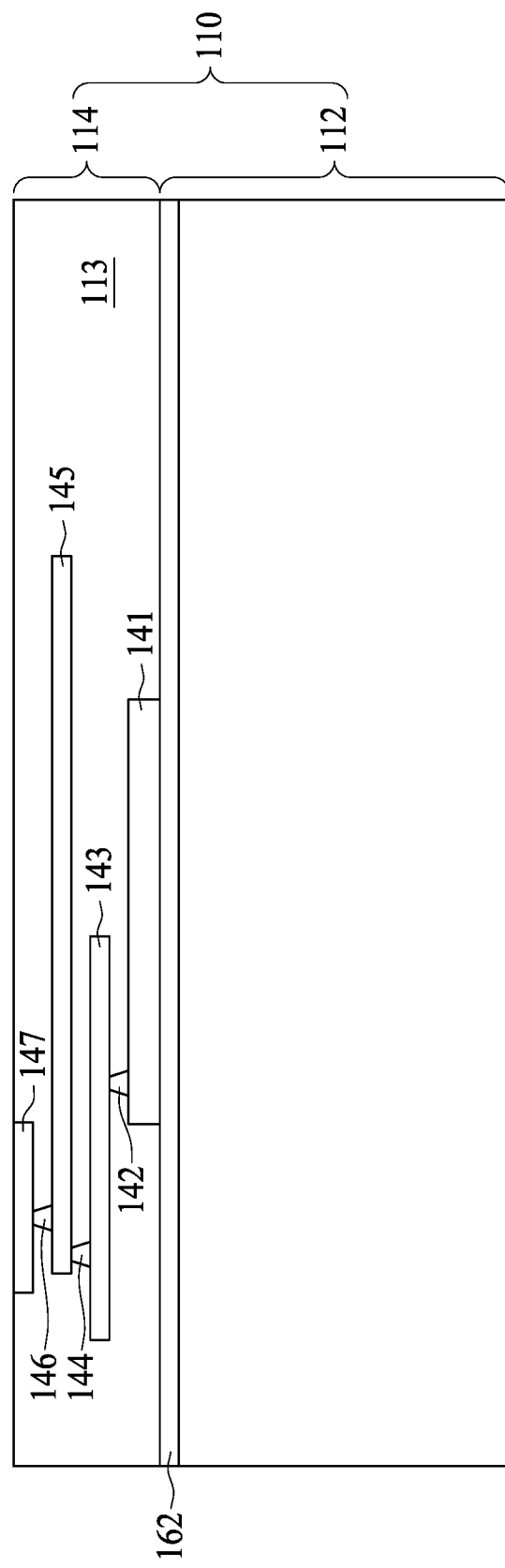
Figure 2C:
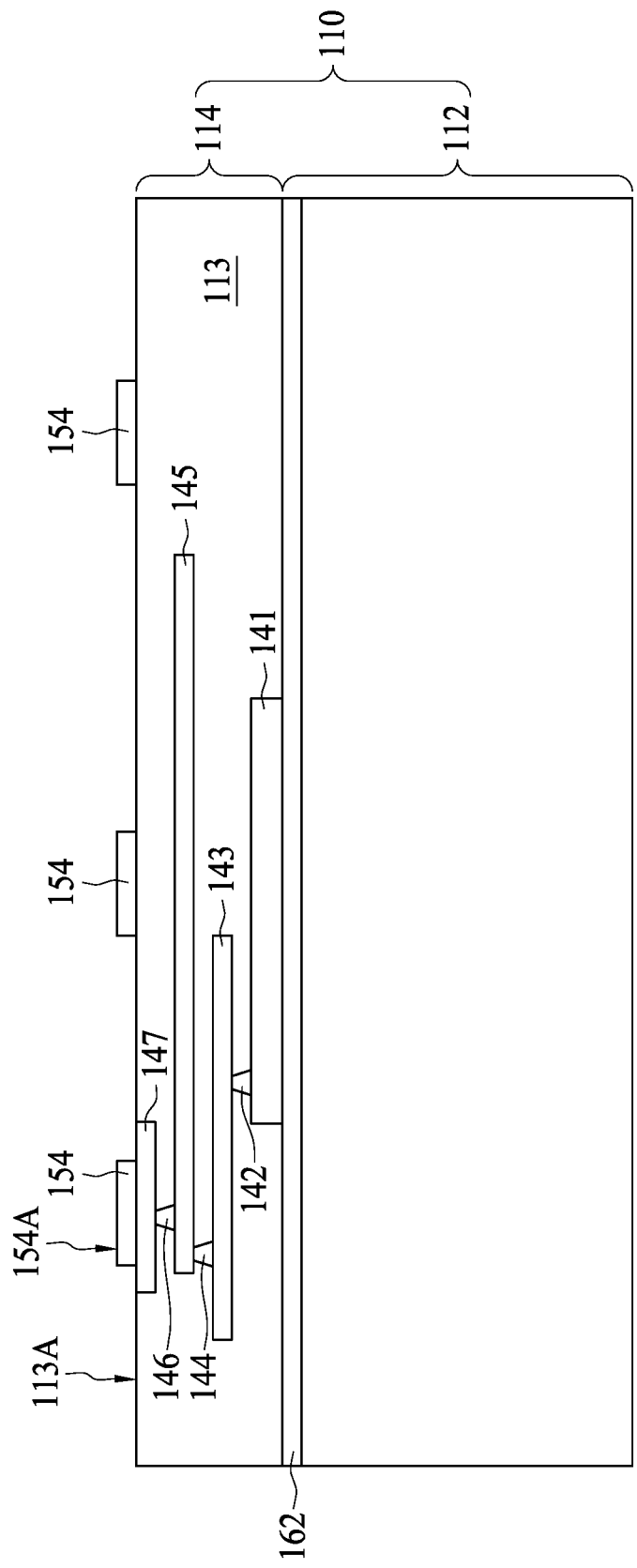
Figure 2D:
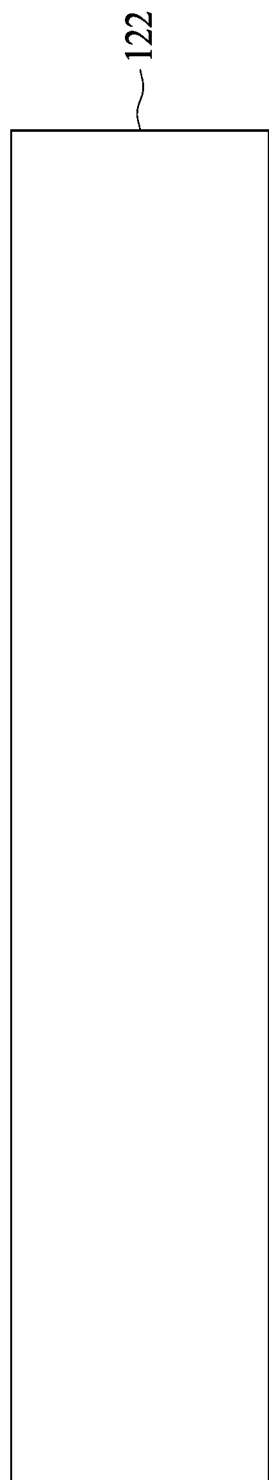
Figure 2E:
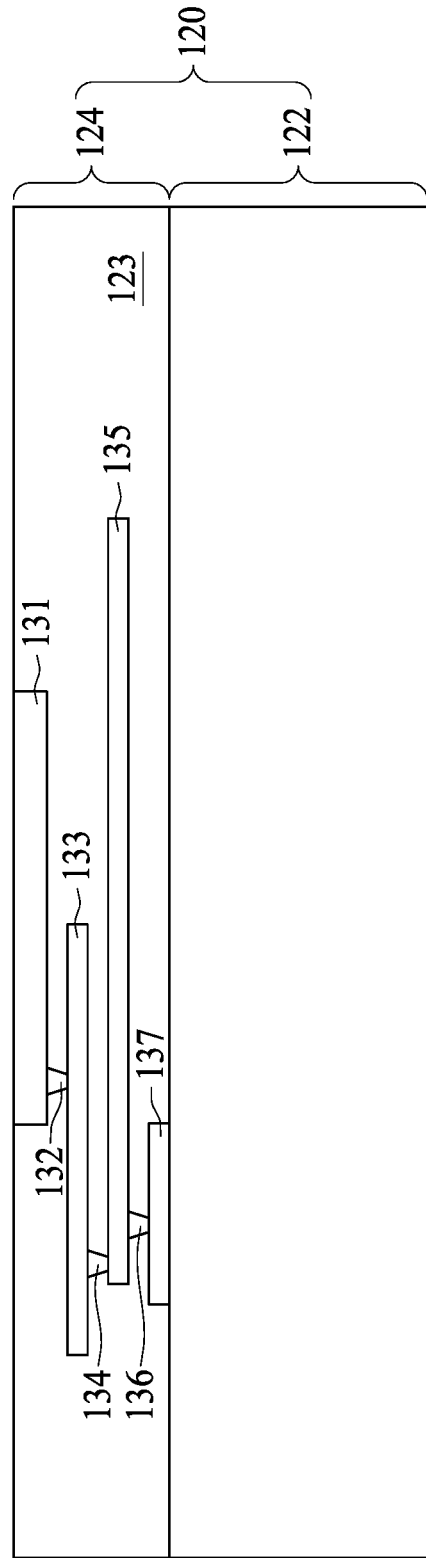
Figure 2F:
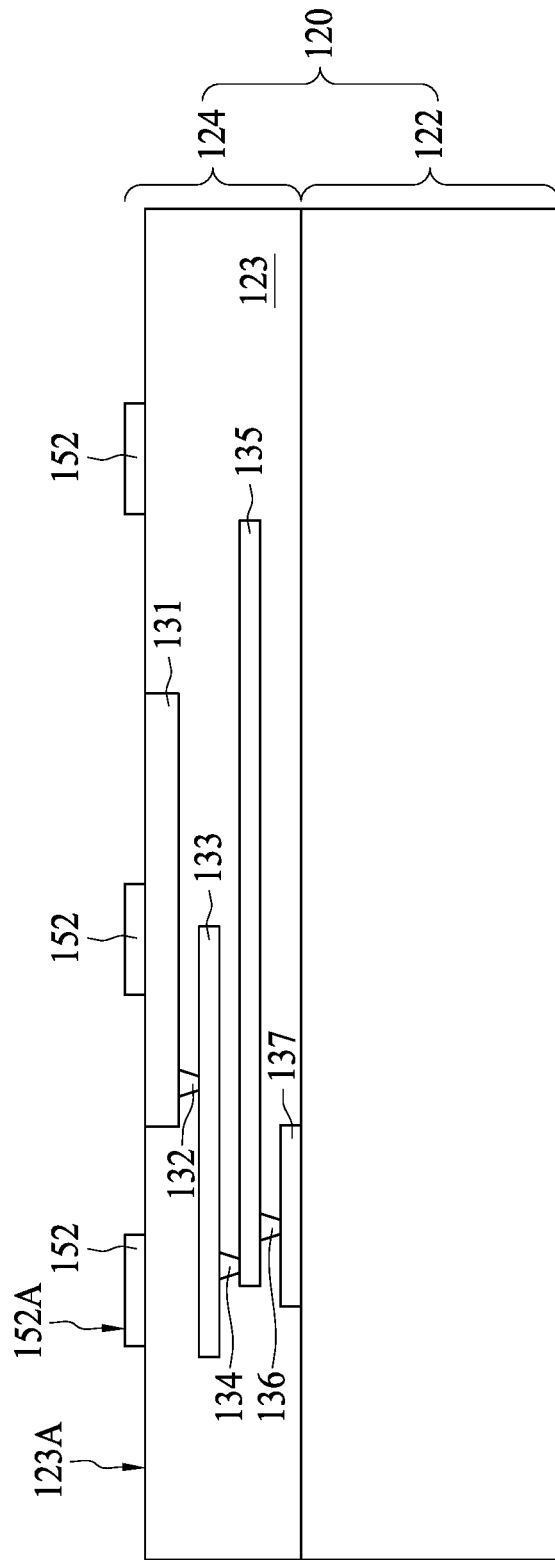
Figure 2G:
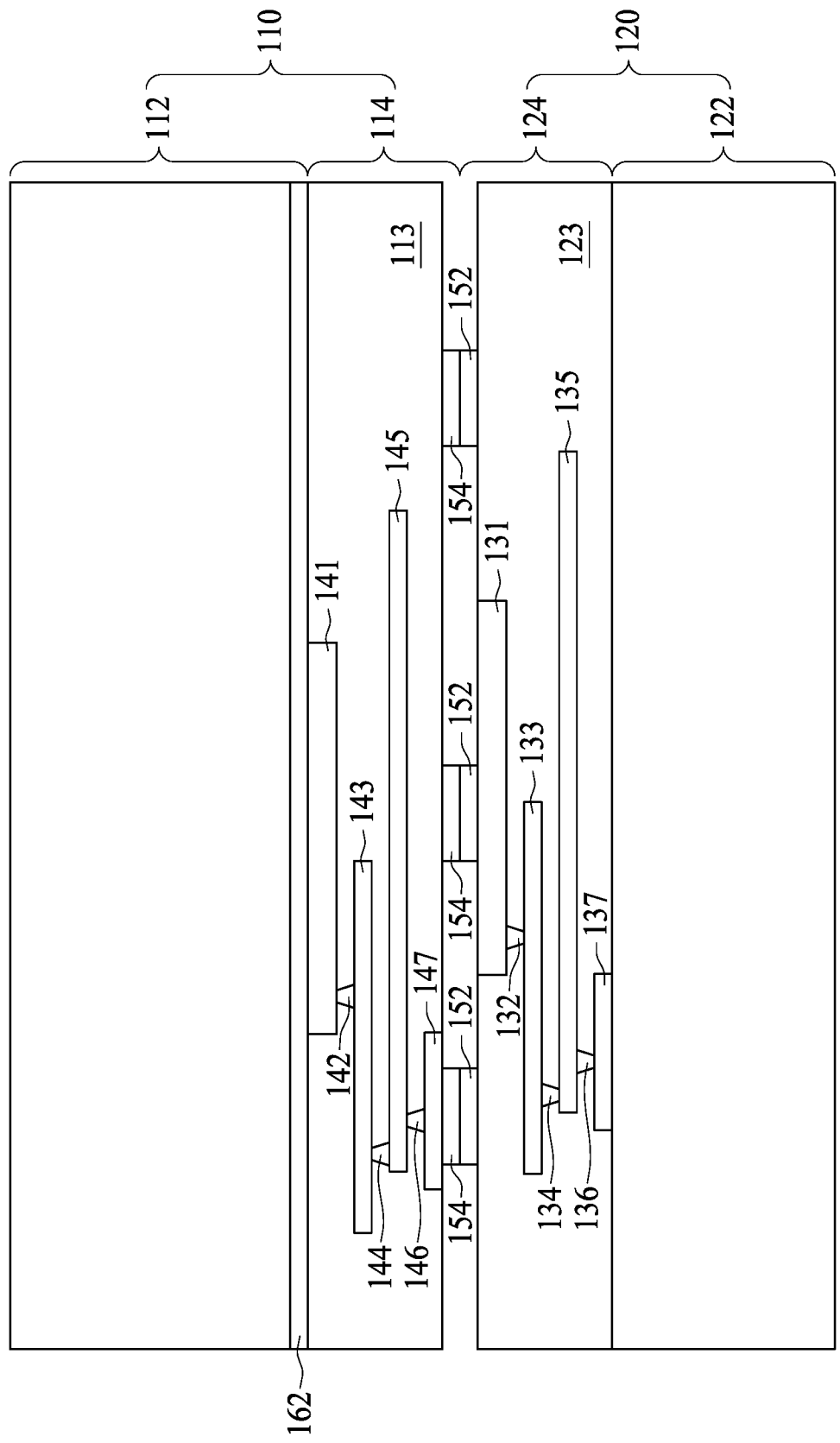
Figure 2H:
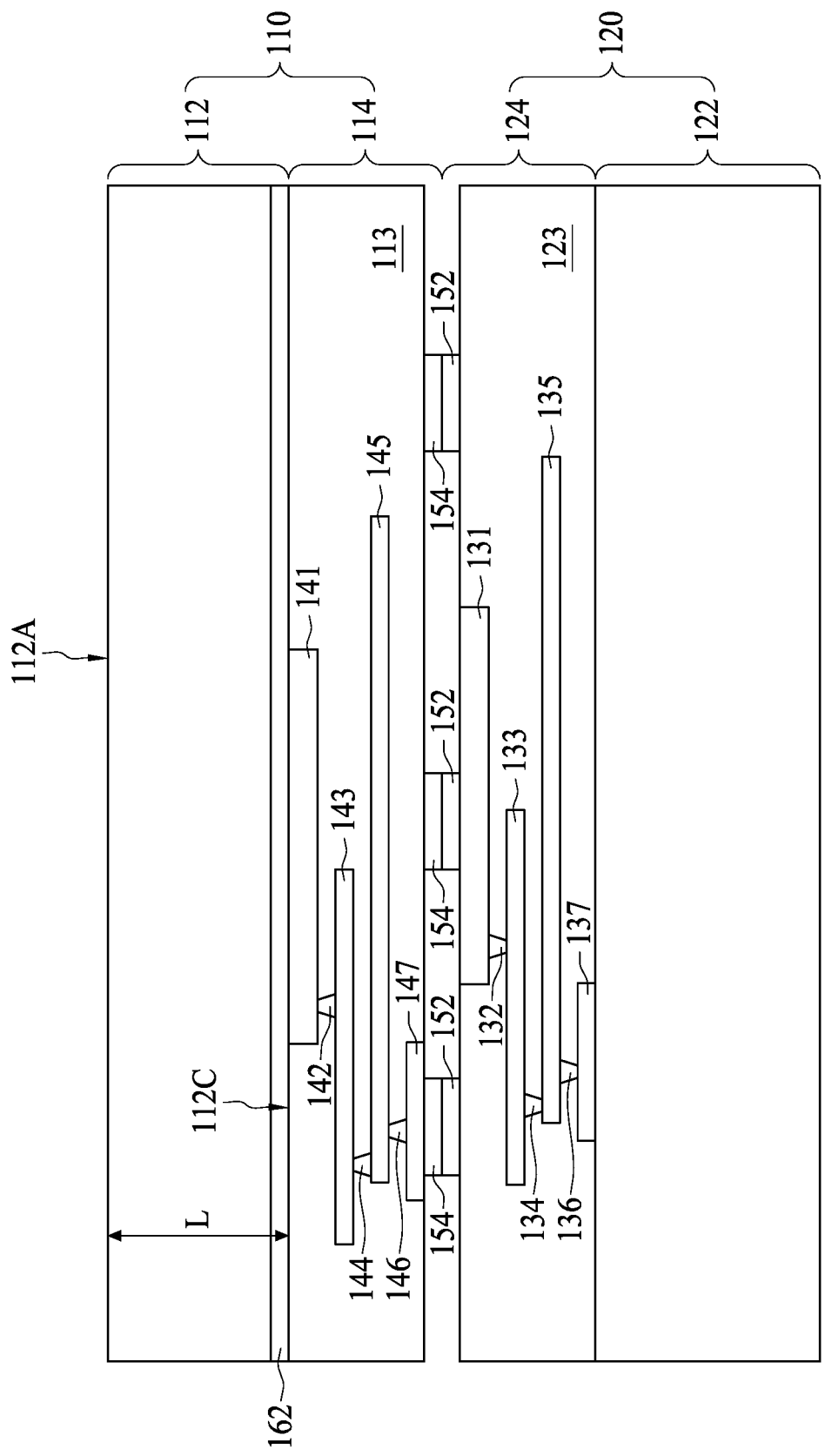
Figure 2I:
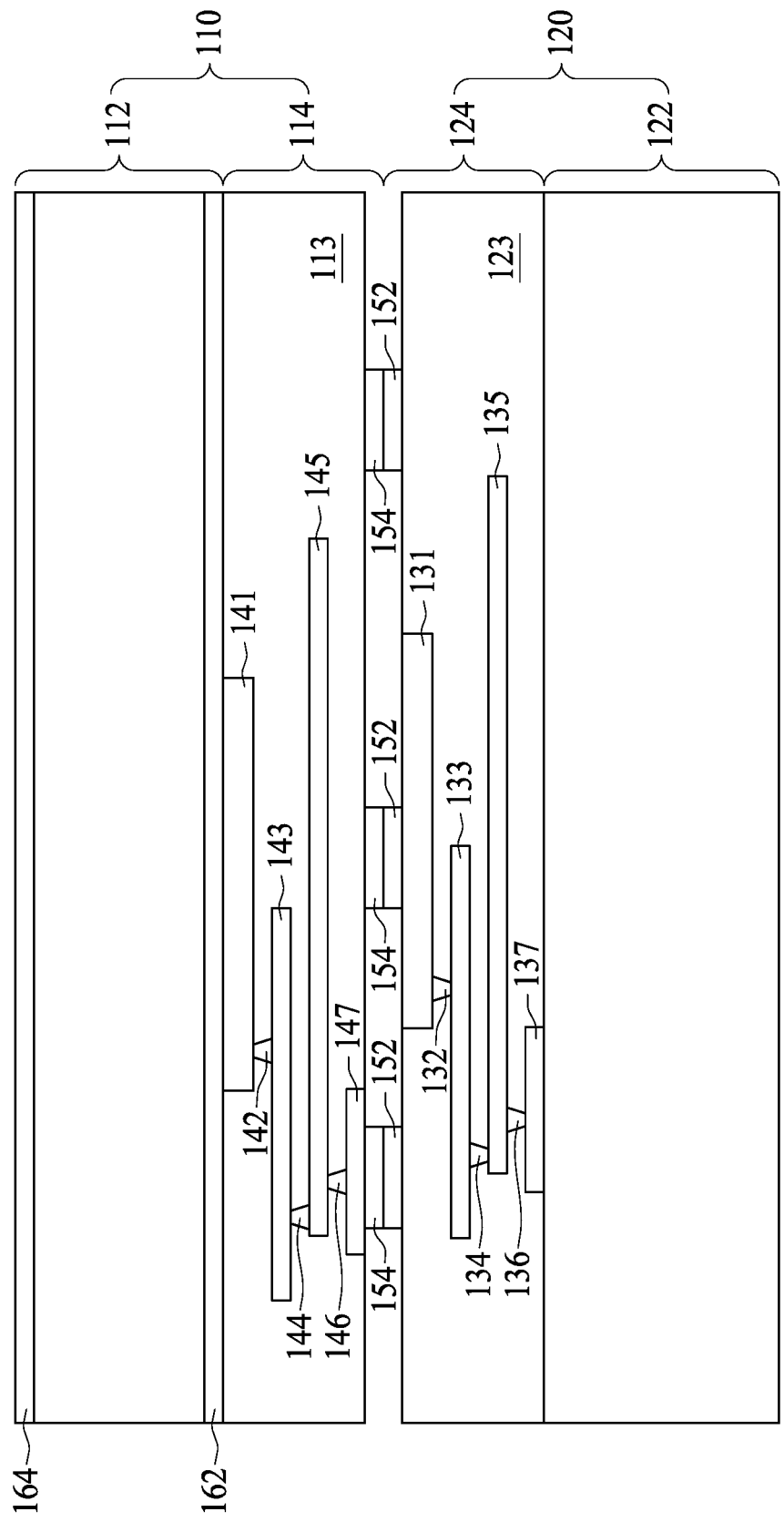
Figure 2J:
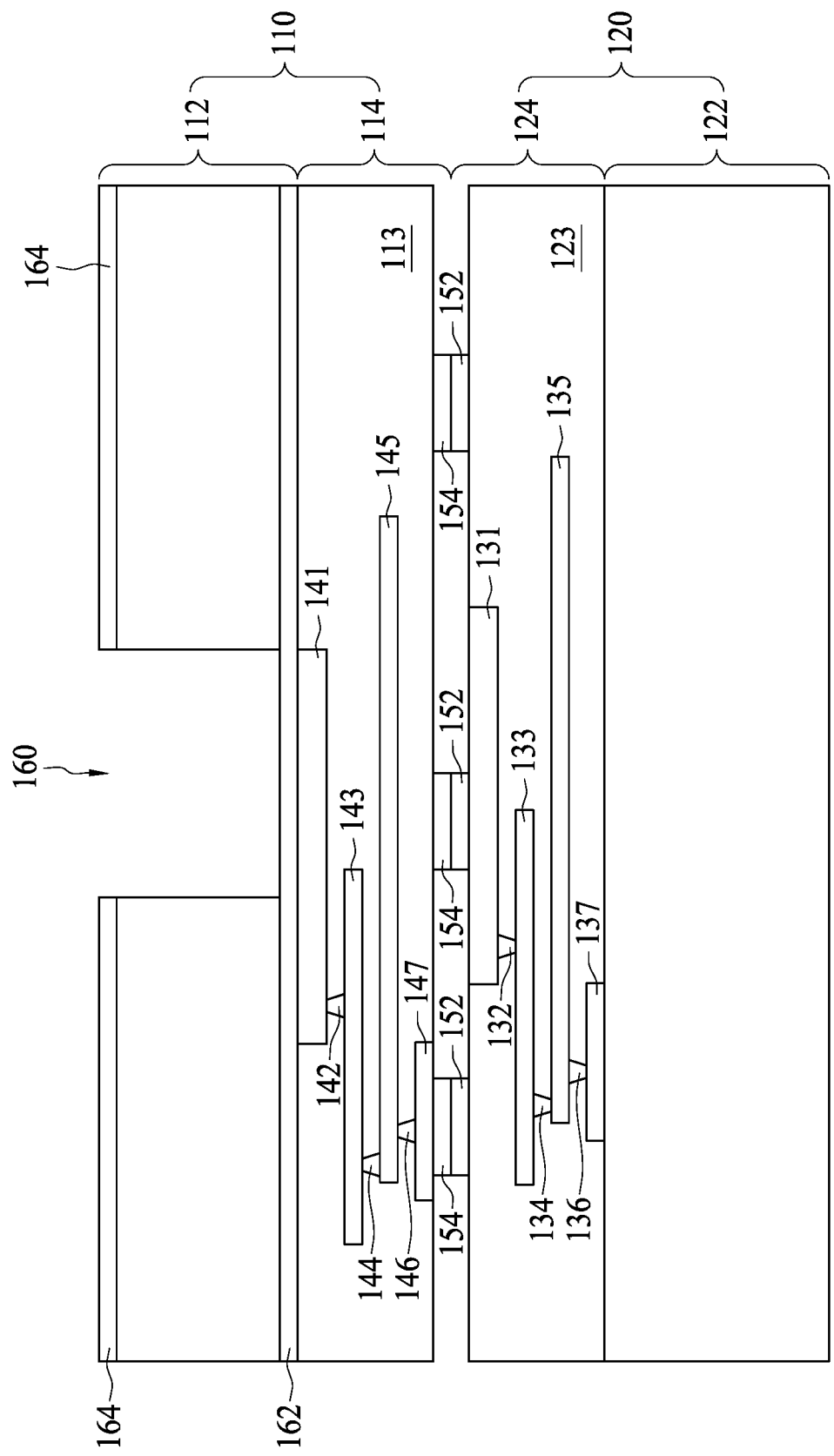
Figure 2K:
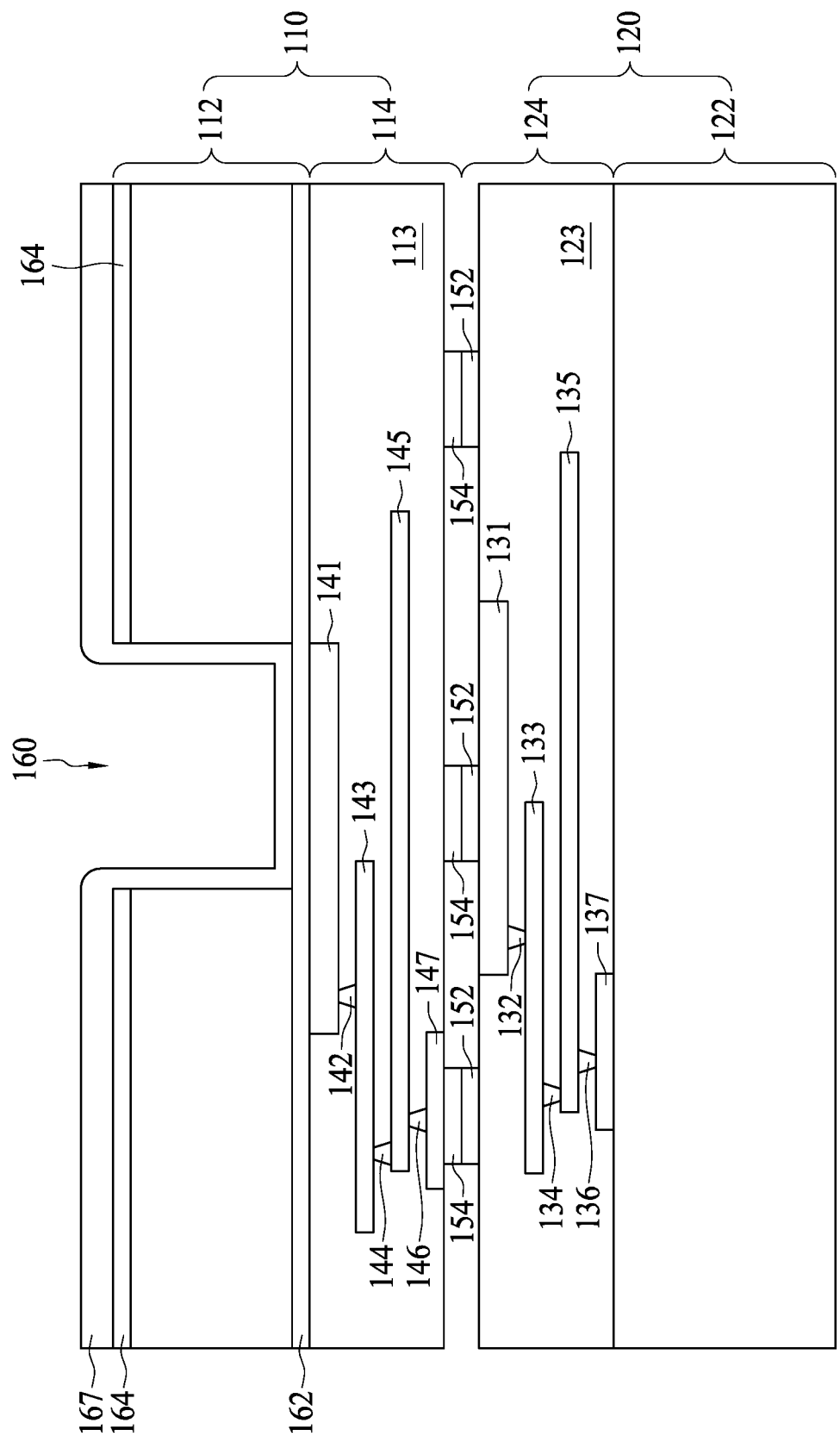
Figure 2L:
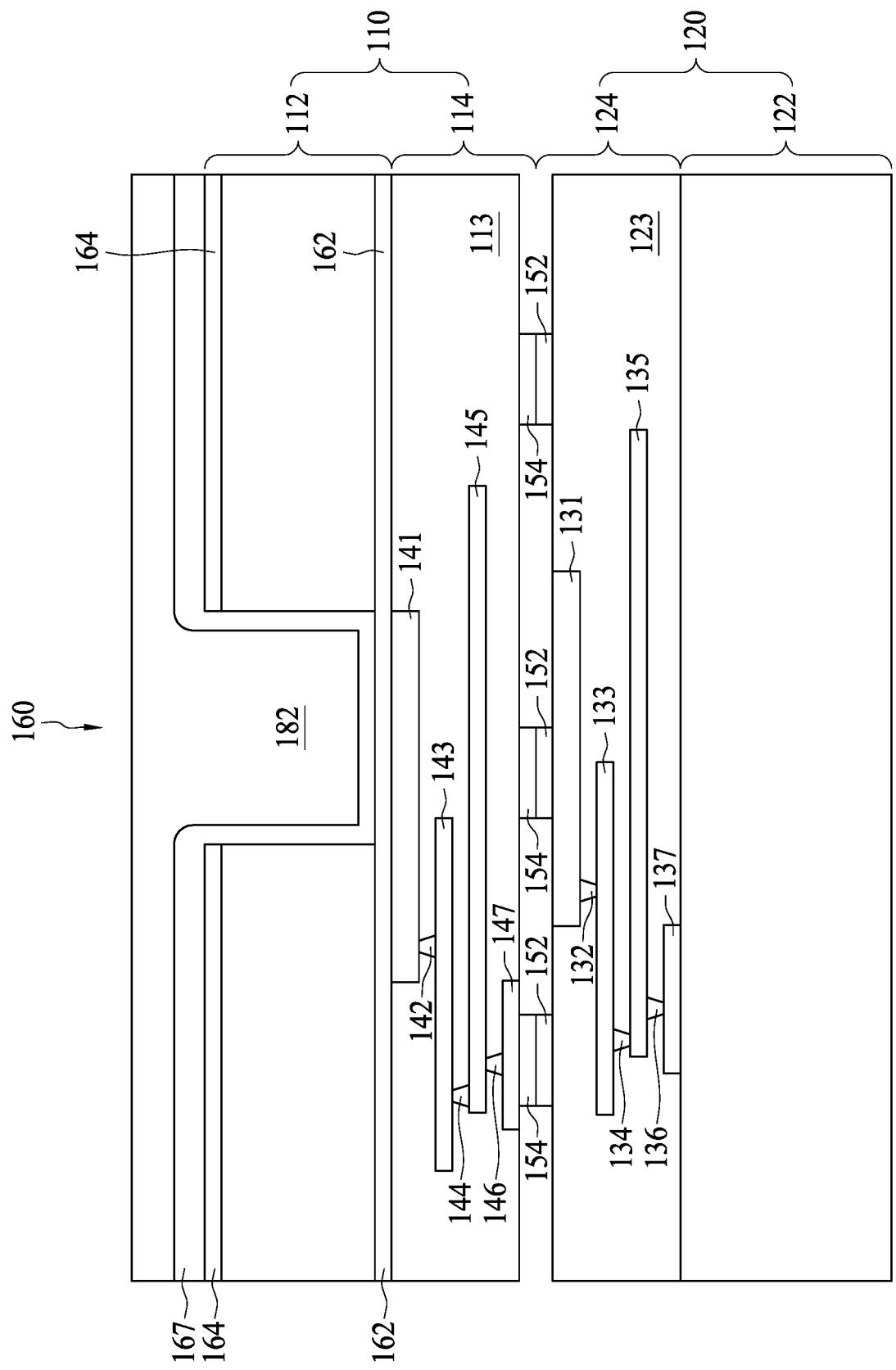
Figure 2M:
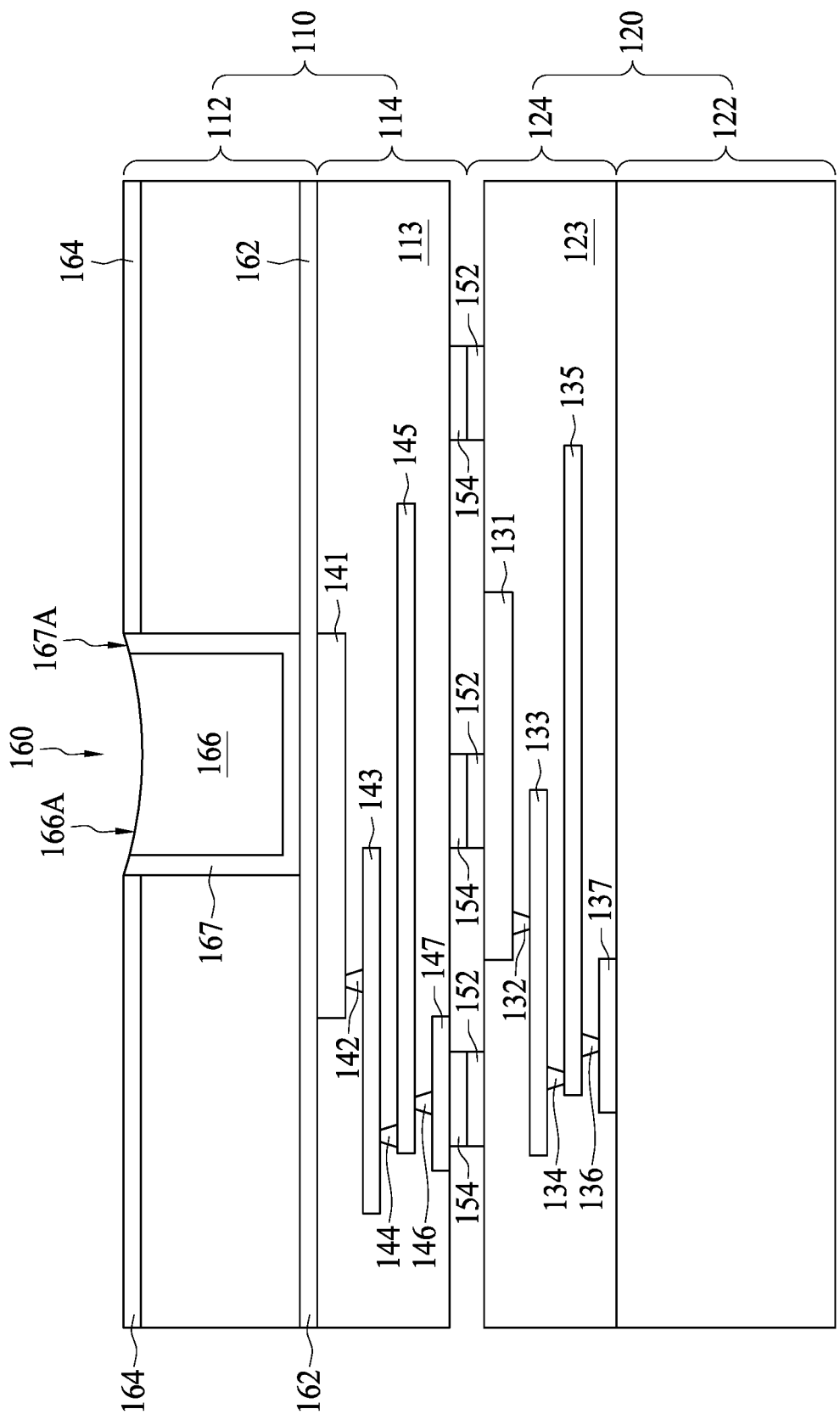
Figure 2N:
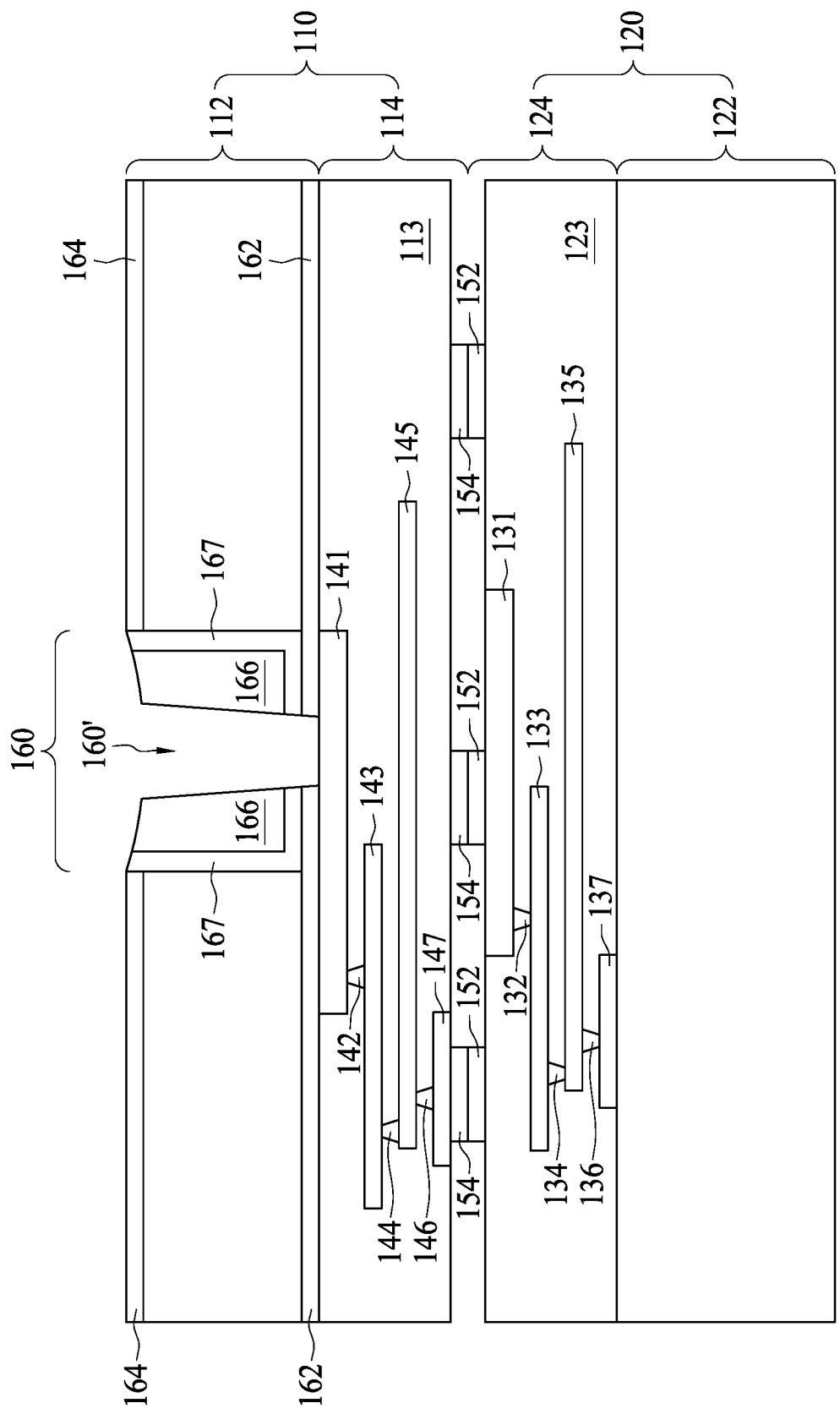
Figure 2O:
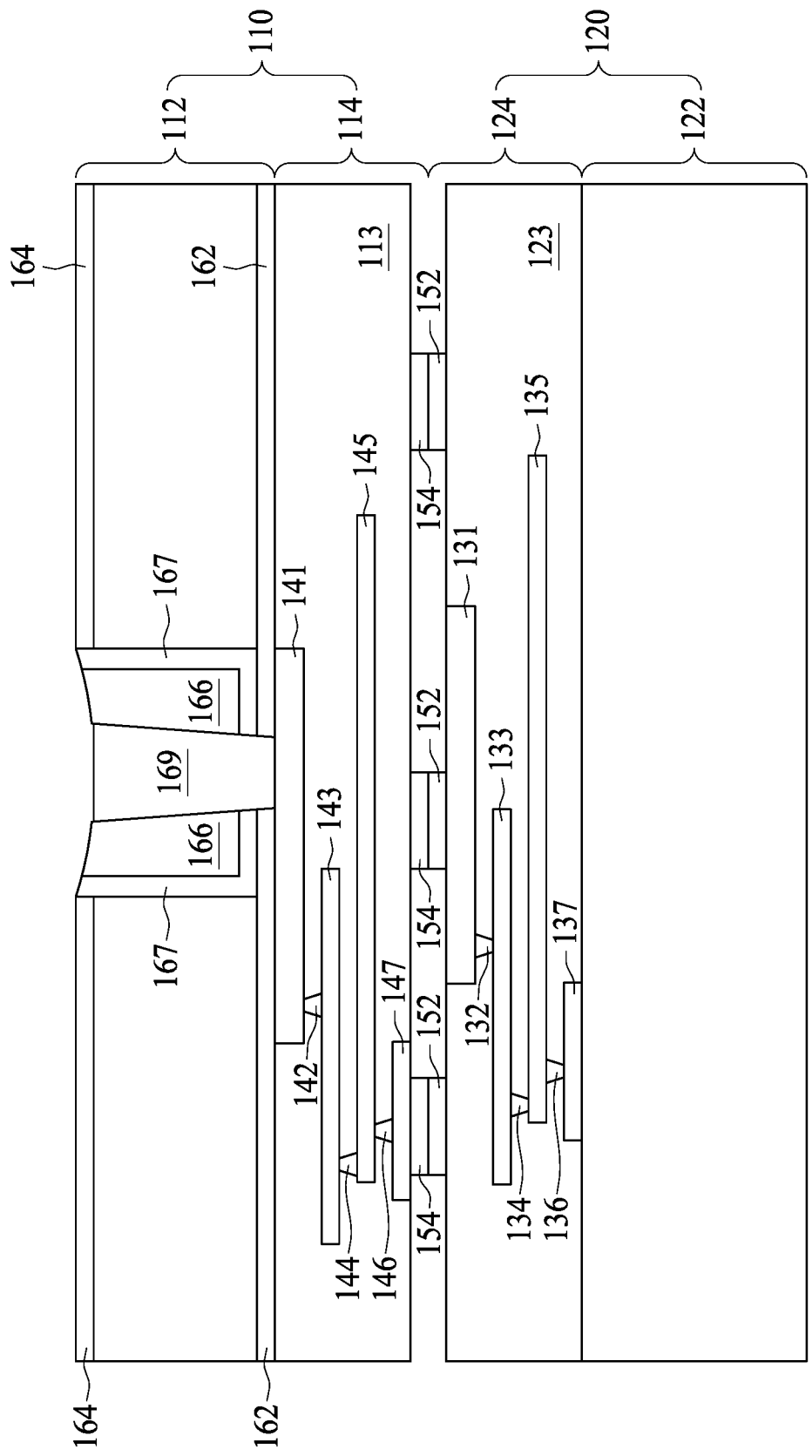
Figure 2P:
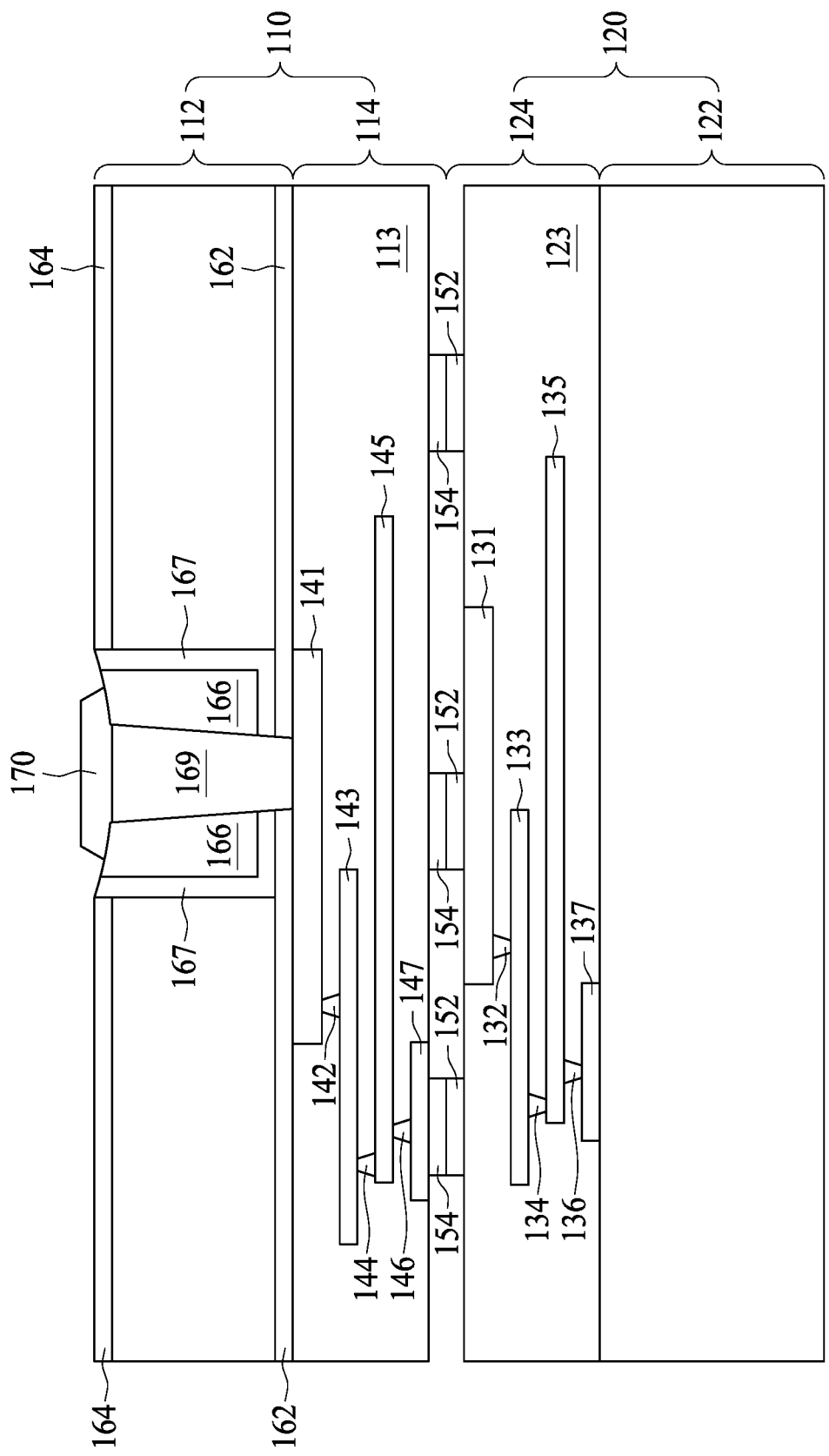
Figure 2Q:
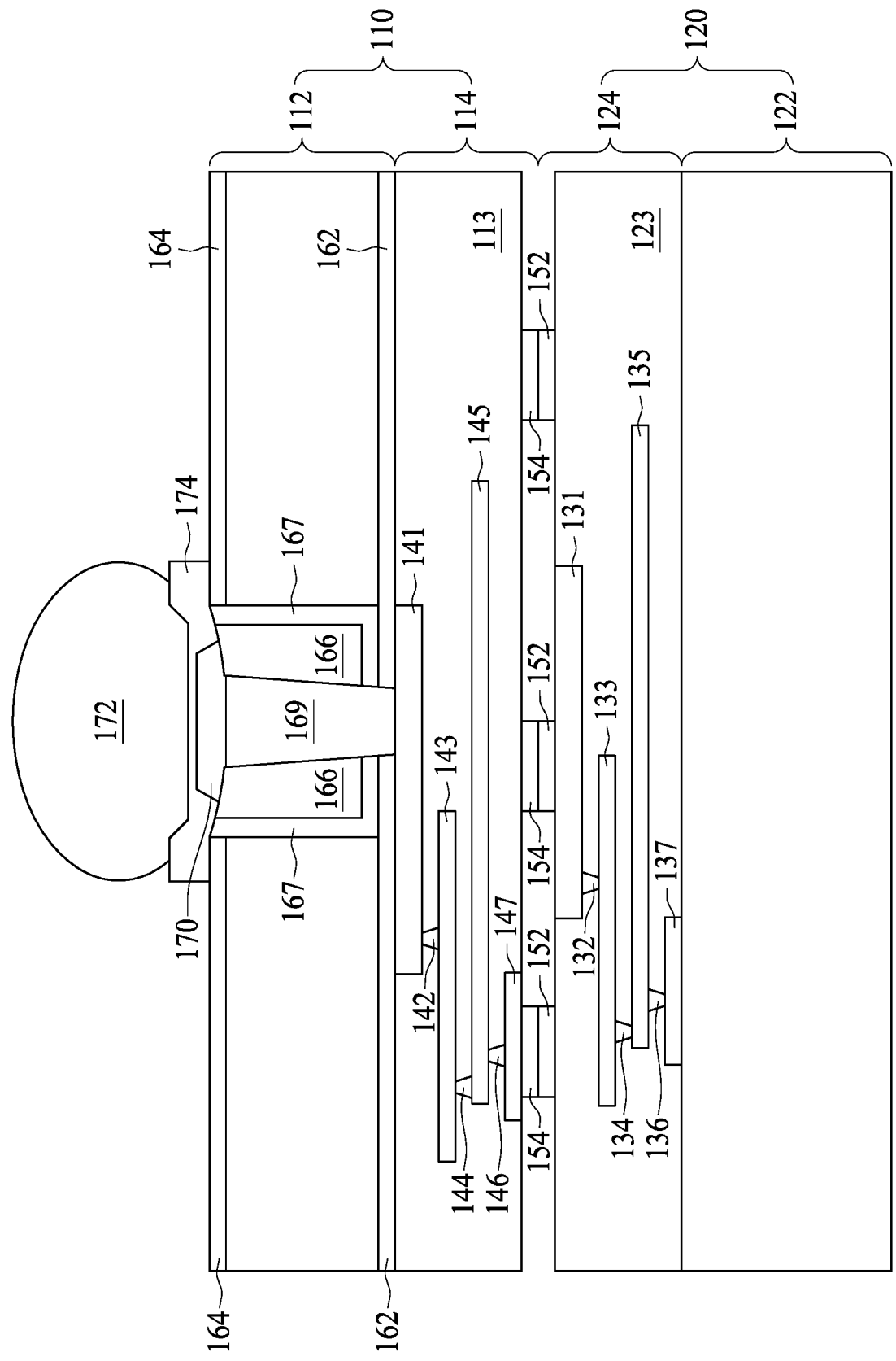

FIG. 2A to FIG. 2Q show cross-sectional views of the semiconductor structure 100 of FIG. 1A fabricated at various stages, in accordance with some embodiments of the present disclosure. In FIG. 2A, the first semiconductive substrate 112 is provided. In some embodiments, at least one structure of a sensing device (not shown) may be formed in the first semiconductive substrate 112. The first semiconductive substrate 112 has a first dopant type, such as a P-type.

In some embodiments, a dielectric 162 is blanket deposited at a topmost level of the first semiconductive substrate 112. The dielectric 162 may be formed by vapor deposition or spin coating. "Vapor deposition" refers to processes of depositing materials on a substrate though the vapor phase. Vapor deposition processes include any process such as, but not limited to, chemical vapor deposition (CVD) and physical vapor deposition (PVD). Examples of vapor deposition methods include hot filament CVD, radio-frequency CVD (rf-CVD), laser CVD (LCVD), conformal diamond coating processes, metal-organic CVD (MOCVD), sputtering, thermal evaporation PVD, ionized metal PVD (IMPVD), electron beam PVD (EBPVD), reactive PVD, atomic layer deposition (ALD), plasma-enhanced CVD (PECVD), high-density plasma CVD (HDPCVD), low-pressure CVD (LPCVD) and the like. In some embodiments, the dielectric 162 includes silicon oxide or silicon nitride. In some embodiments, the upper most level dielectric 162 is also configured as a passivation layer.

Referring to FIG. 2B, the first interconnect structure 114 is formed over the first semiconductive substrate 112. The first interconnect structure 114 may be formed of stacked metal layers from a bottom layer to a top layer. For example, the metal layer 147 is formed by depositing a mask layer (not separately shown) on the first semiconductive substrate 112. The mask layer is patterned through an etching operation to form desired patterns for the metal layer 141. Then, conductive materials are filled in the etched patterns. The mask layer is striped by a removing operation after the pattern is filled with conductive materials. The IMD material 113 may be filled among the conductive materials of the metal layer 141. Similarly, the conductive via layer 142 is formed over the metal layer 141 in order to generate a conductive connection between the metal layer 141 and the overlaying metal layer 142. The metal layers 143, 145 and 147 are formed in sequence along with the intervening conductive via layers 144 and 146. A portion of the metal layer 147 is exposed from the first interconnect structure 114.

Referring to FIG. 2C, several bond pads 154 are formed at a topmost level of the first interconnect structure 114. In some embodiments, each of the bond pads 154 has a top surface 154A higher than a top surface 113A of the IMD 113.

In some embodiments (not shown), the top surface 113A may be configured to level with the top surface 154A such that the first interconnect structure 114 has a planarized top surface 114A of FIG. 1A. The first semiconductive substrate 112 and the first interconnect structure 114 constitutes the first semiconductor device 110.

FIGS. 2D-2F show cross-sectional views of the second semiconductor device 120 fabricated at various stages, in accordance with some embodiments of the present disclosure. The second semiconductive substrate 122 is provided as shown in FIG. 2D. In some embodiments, at least one active or passive structure (not shown) may be formed in the first semiconductive substrate 122. The first semiconductive substrate 122 has a first dopant type, such as a P-type.

Referring to FIG. 2E, the second interconnect structure 124 is formed over the second semiconductive substrate 122. The second interconnect structure 124 may be formed of stacked metal layers. In some embodiments, the second interconnect structure 124 is formed from bottom to top, wherein such process is similar to the formation of the first interconnect structure 114. For example, the metal layers 131, 133, 135 and 137 are formed over one another along with corresponding intervening conductive via layers 132, 134 and 136. The IMD 123 is filled among the aforesaid metal layers in order to complete the second interconnect structure 124. A portion of the metal layer 131 is exposed from the first interconnect structure 114.

Referring to FIG. 2F, several bond pads 152 are formed at a topmost level of the second interconnect structure 124. In some embodiments, each of the bond pads 152 has a top surface 152A higher than a top surface 123A of the IMD 123. In some embodiments (not shown), the top surface 123A may be configured to level with the top surface 152A such that the first interconnect structure 124 has a planarized top surface 124A of FIG. 1A. The second semiconductive substrate 122 and the second interconnect structure 124 constitutes the first semiconductor device 120.

The first semiconductor device 110 is flipped and bonded with the semiconductor device 120 as shown in FIG. 2G. The bond pads 154 are electrically bonded with corresponding bond pads 152.

Referring to FIG. 2H, the first semiconductive substrate 112 is thinned down. The thinned semiconductive substrate 112 is thinned to a thickness L measured from a bottom surface 112C to the top surface 112A. In some embodiments, the thickness L is from about 20 um to about 500 um. In some embodiments, the thickness L is from about 20 um to about 300 um. In some embodiments, the thickness L is from about 40 um to about 120 um.

In FIG. 2I, the dielectric 164 is formed over the first semiconductor device 110. In some embodiments, the dielectric 164 may be configured as a passivation layer. In some embodiments, the dielectric 164 includes silicon oxide or silicon nitride. The dielectric 164 may be formed by a deposition operation, such as hot filament CVD, rf-CVD, laser CVD (LCVD), conformal diamond coating processes, MOCVD, thermal evaporation PVD, HDPCVD, LPCVD and the like.

In FIG. 2J, the first via 160 is formed in the first semiconductor substrate 112. The first via 160 may be formed by deposition of a mask layer. The mask layer can be a photoresist mask or hard mask, such as nitride. Then, an etching operation is performed with the mask layer in place. The first via 160 is formed by a suitable etching process, such as a dry etch operation. In some embodiments, the dry etch in the present operation includes a reactive ion etch (RIE) adopting fluorine-containing gases. The mask layer is removed after the first via 160 is completed.

In FIG. 2K, a dielectric material 167 is conformally formed over the first semiconductive substrate 112. In some embodiments, the dielectric material 167 is a different material from that of the dielectric 164. In some embodiments, the dielectric 167 is formed over the dielectric 164, and the sidewalls and bottom surface of the first via 160. The dielectric 167 may be formed by a suitable deposition process, such as a CVD or PVD operation.

In FIG. 2L, a dielectric material 182 is blanket deposited over the dielectric 167. The dielectric material 182 fills the first via 160. In some embodiments, the dielectric material 182 is different from that of the dielectric 167. In some embodiments, the dielectric material 182 is different from that of the dielectric 164.

In FIG. 2M, a removal operation is performed to remove excessive materials above the dielectric layer 164. After the removal operation, a portion of the dielectric layer 167 is left on the sidewalls and bottom surface of the first via 160. As a result, the dielectric 166 is formed in the first via 160. Also, the dielectric 164 is exposed by the removal operation. In some embodiments, the removal operation may be performed by a suitable process, such as a chemical mechanical polishing (CMP) operation. In some embodiments, a portion of the top surface of the filled first via 160, which includes the surfaces 166A and 167A, may include a curve surface due to the dishing effect. In some embodiments, the top surface of the first via 160 may include a concave shape, such as an upwardly concave shape. Therefore, the dielectric 166 may include a top surface 166A with a curved shape. For example, the top surface 166A may include an upwardly concave shape. In some embodiments, the dielectric 167 may include a top surface 166A with a curved shape. For example, the top surface 167A may include an upwardly concave shape.

In FIG. 2N, the second via 160' is formed in the dielectric 166. The second via 160' is extended downward and exposes the metal layer 141. The second via 160' may be formed by deposition of a mask layer. Then, an etching operation is performed with the mask layer in place. The second via 160' is formed by a suitable etching process, such as a dry etch operation. In some embodiments, the dry etch in the present operation includes a reactive ion etch (RIE) adopting fluorine-containing gases. The mask layer is removed after the second via 160' is completed.

Referring to FIG. 2O, the first layer 169 is formed in the second via 160'. The first layer 169 may be formed by a by a variety of techniques, e.g., electroplating, electroless plating, high-density ionized metal plasma (IMP) deposition, high-density inductively coupled plasma (ICP) deposition, sputtering, PVD, CVD, LPCVD, plasma-enhanced chemical vapor deposition (PECVD), and the like.

Referring to FIG. 2P, the second layer 170 is formed over the second via 160'. Also, the second layer 170 is formed on the first layer 169. The second layer 170 may be formed by a by a variety of techniques, e.g., electroplating, electroless plating, high-density ionized metal plasma (IMP) deposition, high-density inductively coupled plasma (ICP) deposition, sputtering, PVD, CVD, LPCVD, plasma-enhanced chemical vapor deposition (PECVD), and the like.

Referring to FIG. 2Q, the UBM 174 is formed over the first via 160. In some embodiments, the UBM 174 covers a portion of the dielectric 164. Then, the connector 172 is formed over the UBM 174.

In view of the foregoing, the present disclosure provides a semiconductor structure in which an improved bond pad is proposed for enhancing structural resistance to foreign stress. The bond pad may comprise at least two layers of conductive materials. The bond pad is disposed in a via. Among the two layers of the bond pad, a first layer comprises a conductive material, such as nickel. Also, the second layer comprises a conductive material, such as gold. In addition, the second layer comprises a cap portion covering the via. Thus, the bond pad exhibits greater stress resistance. The risk of structure cracking or peeling is alleviated accordingly.

The present disclosure provides a semiconductor structure. The semiconductor structure comprises a semiconductive substrate and an interconnect structure over the semiconductive substrate. The semiconductor structure also comprises a bond pad in the semiconductive substrate and coupled to the metal layer. The bond pad comprises two conductive layers.

The present disclosure provides a semiconductor structure comprising a first semiconductor device and a second semiconductor device. The first semiconductor device comprises a first semiconductive substrate, a first interconnect structure over the first semiconductive substrate, a terminal in the first semiconductive substrate where the terminal is configured to electrically couple the first interconnect structure with a connector over the first semiconductive substrate, and a dielectric surrounding the terminal. The second semiconductor device comprises a second semiconductive substrate. The second semiconductor device also comprises a second interconnect over the second semiconductive substrate and configured to bond with the first interconnect structure. The terminal comprises a first layer connected to the second interconnect structure and a second layer extending over the dielectric.

The present disclosure provides a method of manufacturing a semiconductor structure. The method comprises: providing a first semiconductive substrate; forming a first interconnect structure over the first semiconductive substrate; providing a second semiconductive substrate; forming a second interconnect structure over the first semiconductive substrate; bonding the first interconnect structure with the second interconnect structure; forming a first via in the first semiconductive substrate, the via exposing a portion of a top surface of a metal layer in the first interconnect structure; depositing a dielectric in the first via; forming a second via in the dielectric; depositing a first conductive layer in the second via; and depositing a second conductive layer over the first conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a semiconductive substrate having a first surface and a second surface opposing the first surface;
a first dielectric layer over second surface of the semiconductive substrate;
an interconnect structure extending from the first surface of the semiconductive substrate;
a second dielectric layer within the semiconductive substrate and extending from the first surface to the second surface of the semiconductive substrate, wherein the second dielectric layer includes a first top surface adjacent the second surface of the semiconductive substrate, wherein the first top surface is a concave surface;
a via extending through the semiconductive structure to the interconnect structure and having sidewalls defined by the second dielectric layer, wherein a first conductive layer fills a bottom portion of the via to a second top surface of first conductive layer disposed within the via and a second conductive layer is disposed on the second top surface of the first conductive layer and extends to a third top surface of the second conductive layer, wherein the third top surface is below the concave surface of the first top surface of the second dielectric layer;
an under bump metallization (UBM) layer directly on the third top surface of the second conductive layer and directly on the first top surface of the second dielectric layer; and
a bump on the UBM layer.

2. The semiconductor structure of claim 1, wherein a material of the first conductive layer has a Young's modulus from about 180 GPa to about 220 GPa.

3. The semiconductor structure of claim 2, wherein the second conductive layer has a Young's modulus from about 50 GPa to about 120 GPa.

4. The semiconductor structure of claim 1, wherein the second conductive layer is a gold layer and the first conductive layer is a nickel layer, the gold layer being configured to connect to a solder bump.

5. The semiconductor structure of claim 4, wherein the nickel layer comprises a height from about 20,000 Å to about 25,000 Å.

6. The semiconductor structure of claim 1, wherein a ratio of Young's moduli between the first and second conductive layers is from about 1.5 to about 3.5.

7. The semiconductor structure of claim 1, wherein the third top surface of the second conductive layer is gold.

8. The semiconductor structure of claim 1, further comprising:
a third dielectric layer between the second dielectric layer and the semiconductive substrate.

9. The semiconductor structure of claim 8, wherein the UBM layer is formed directly on a top surface of the third dielectric layer.

10. The semiconductor structure of claim 1, wherein the second dielectric layer comprises a multi-layer structure.

11. A semiconductor structure, comprising:
a first semiconductive substrate;
a first interconnect structure over a first surface of the first semiconductive substrate, the first semiconductive substrate having a second surface opposing the first surface;
a first dielectric layer extending through the first semiconductive substrate to provide a third surface adjacent the second surface of the first semiconductive substrate;
a first via extending through the first semiconductive substrate from the second surface to a surface of the first interconnect structure, wherein the first via has a first sidewall defined by the first dielectric layer and a second sidewall defined by the first dielectric layer, wherein the second sidewall opposes the first sidewall and wherein the first via has a bottom portion of the first via filled with a first conductive material extending from the first sidewall of the first via to the second sidewall of the first via;

a second conductive material over the first conductive material, wherein the second conductive material fills an upper portion of the first via extending from the first sidewall of the first via to the second sidewall of the first via, and wherein the second conductive material includes a top surface;

an under bump metallization (UBM) layer disposed directly on the top surface of the second conductive material and directly on the third surface of the first dielectric layer; and a connector over the UBM layer.

12. The semiconductor structure of claim 11, wherein the top surface of the second conductive material is lower than the third surface of the first dielectric layer.

13. The semiconductor structure of claim 11, wherein the third surface of the first dielectric layer extends from a first point to a second point lower than the first point, wherein the second point is coplanar with the top surface of the second conductive material.

14. The semiconductor structure of claim 11, wherein a thickness of the first conductive material is greater than a thickness of the second conductive material.

15. The semiconductor structure of claim 11, wherein the first dielectric layer includes a first dielectric composition and a second dielectric composition, and wherein the first conductive material interfaces each of the first dielectric portion and the second dielectric composition and the second conductive material interfaces the first dielectric composition and has no interface with the second dielectric composition.

16. A semiconductor structure, comprising:
a substrate having a first surface and a second surface opposing the first surface;
an interconnect structure over the first surface of the substrate;
an under bump metallization (UBM) layer over the second surface;
a terminal extending through the substrate coupling the interconnect structure and the UBM layer, wherein the terminal includes a first conductive layer and a second conductive layer, the second conductive layer being disposed on the first conductive layer and interfacing the UBM layer, and wherein the first conductive layer consists of a first material and the second conductive layer comprises a second material, the second material different than the first material such that the ratio of the Young's modulus of the first material to the Young's modulus of the second material is between 1.5 to 3.5; and
a dielectric layer surrounding the terminal and disposed within the substrate, wherein the first conductive layer and the second conductive layer each interface the dielectric layer, and wherein the dielectric layer has a concave top surface interfacing the UBM layer.

17. The semiconductor structure of claim 16, wherein the second conductive layer of the second material contiguously extends from an interface with the first conductive layer to interfacing a sidewall surface of the dielectric layer.

18. The semiconductor structure of claim 16, the second conductive layer has a top surface coplanar with a point on the concave top surface of the dielectric layer.

19. The semiconductor structure of claim 16, wherein the dielectric layer is a multi-layer structure.

20. The semiconductor structure of claim 16, wherein the first conductive layer is nickel and the second conductive layer is gold.

* * * * *